United States Patent [19]
Van Houdt et al.

[11] Patent Number: 5,969,991
[45] Date of Patent: *Oct. 19, 1999

[54] METHOD OF ERASING A FLASH EEPROM MEMORY CELL ARRAY OPTIMIZED FOR LOW POWER CONSUMPTION

[75] Inventors: Jan F. Van Houdt, Bekkevoort; Luc Haspeslagh, Kortrijk; Ludo Deferm, Beverlo; Guido Groeseneken, Leuven; Herman Maes, Bierbeek, all of Belgium

[73] Assignee: Interuniversitair Micro-Elektronica Centrum VZW, Leuven, Belgium

[*] Notice: This patent issued on a continued prosecution application filed under 37 CFR 1.53(d), and is subject to the twenty year patent term provisions of 35 U.S.C. 154(a)(2).

[21] Appl. No.: 08/867,329

[22] Filed: Jun. 2, 1997

Related U.S. Application Data

[60] Division of application No. 08/694,812, Aug. 9, 1996, which is a continuation-in-part of application No. 08/426,685, Apr. 21, 1995
[60] Provisional application No. 60/002,197, Aug. 11, 1995.

[51] Int. Cl.[6] ................................................. G11C 11/34
[52] U.S. Cl. .............................. 365/185.28; 365/185.29; 365/185.14
[58] Field of Search ....................... 365/185.28, 185.29, 365/185.14, 185.15, 185.16

[56] References Cited

U.S. PATENT DOCUMENTS

| | | |
|---|---|---|
| 5,029,130 | 7/1991 | Yeh . |
| 5,042,009 | 8/1991 | Kazerounian ...................... 365/185.16 |
| 5,077,691 | 12/1991 | Haddad et al. . |
| 5,212,541 | 5/1993 | Bergemont .......................... 365/185.14 |
| 5,235,544 | 8/1993 | Caywood .................................. 365/218 |
| 5,257,225 | 10/1993 | Lee . |
| 5,280,446 | 1/1994 | Ma ..................................... 365/185.15 |
| 5,422,504 | 6/1995 | Chang ................................. 365/185.14 |

FOREIGN PATENT DOCUMENTS 0 501 941 A1   9/1992   European Pat. Off. .

*Primary Examiner*—A. Zarabian
*Attorney, Agent, or Firm*—McDonnell Boehnen Hulbert & Berghoff

[57] ABSTRACT

The present invention is a method for programming SSI cells or an array of said cells. The method achieves very fast programming while consuming only a very small amount of power, which paves the way for new applications such as battery-operated systems, page-mode programming for very high data throughput. The method also allows for the bitline voltage to be increased internally on the chip in order to circumvent the efficiency decrease associated with supply voltage scaling. By exploring the SSI mechanism in the subthreshold regime, an optimum value for the CG voltage is found for which the gate current is no longer maximized, but the energy consumed from the power supply is minimized and the injection efficiency during programming is maximized. The programming of a memory cell in this regime, where the gate current is a very steep function of the CG voltage, is, however, still achieved in a few microseconds while consuming only a very small cell current in the range of nanoamperes. This allows an entire wordline in the array to be programmed simultaneously, even if the supply voltage is scaled down to 3.3V or below. This possibility, combined with a physical programming time per cell which is still very short, realizes an effective programming time in the order of 20 ns/byte for a 1 Mbit device, which corresponds to a maximum programming transfer rate of 50 Mbyte/s. State-of-the-art Flash memories typically show a transfer rate in the order of 20–300 Kbyte/s during programming which is 2 to 3 orders of magnitude slower than in the case of the present invention.

6 Claims, 20 Drawing Sheets

METHOD OF ERASING A FLASH EEPROM MEMORY CELL ARRAY OPTIMIZED FOR LOW POWER CONSUMPTION

RELATED APPLICATIONS

This application is a div. of 08/694,812 filed Sep. 9, 1996 which is a CIP of US patent application 08/426,685 filed Apr. 21, 1995 and of the provisional patent application 60/002,197 filed Aug. 11, 1995. This patent application is related to the U.S. application Ser. No. 08/275,016 and application Ser. No. 08/080,225, both incorporated herein by reference.

BACKGROUND OF THE INVENTION

1. Field of the Invention

The present invention relates to a method for programming a fast-programmable Flash EEPROM (Electrically Erasable Programmable Read-Only Memory) cell, or array of such cells, that rely on the Source-Side Injection (SSI) mechanism for programming. The method is particularly well suited for low-power applications. The invention also relates to a novel low-voltage erase scheme of a fast-programmable Flash EEPROM cell or an array of such cells.

2. The Prior Art

Presently, most Flash memories use Channel Hot Electron Injection (CHEI) at the drain side of the memory cell, or Fowler-Nordheim Tunneling (FNT) for programnming. The CHEI mechanism provides a relatively high programming speed (~10$\mu$s) at the expense of a high power consumption (~1 mA/bit) which limits the number of cells that can be programmed simultaneously (so-called page-mode programming) to a maximum of 8 bytes (Y. Miyawaki et al., IEEE J. Solid-State Circuits, vol.27, p.583, 1992). Furthermore, in order to allow a further scaling of the transistor dimensions towards 0.5 $\mu$m and below, supply voltage scaling from 5V towards 3.3V and below also becomes mandatory. This supply voltage scaling is known to cause considerable degradation of the CHEI efficiency as well as the corresponding programming speed because the high power needed to trigger the CHEI can not be easily supplied on-chip from a high voltage generator or charge pumping circuit. Such additional circuitry increases the complexity and expense of the device.

On the other hand, FNT tunneling provides slower programming times (~100 $\mu$s), but requires a lower power consumption so as to allow larger pages (~4 kbit). This reduces the effective programming time to 1 $\mu$s/byte (T. Tanaka et al., IEEE J. Solid-State Circuits, vol.29, p.1366, 1994). Further improvements are hindered, however, by tunnel-oxide scaling limits and by the very high voltages (~18V) needed on chip for FNT, both compromising device reliability and process scalability.

The recent success of SSI as a viable alternative over FNT and CHEI for Flash programming is mainly due to its unique combination of moderate-to-low power consumption with very high programming speed at moderate voltages. A typical example of such a device relying on SSI for programming is the Applicant's High Injection Metal-Oxide-Semiconductor or HIMOS memory cell (J. Van Houdt et al., 11$^{th}$ IEEE Nonvolatile Semiconductor Memory Workshop, Feb. 1991; J. Van Houdt et al., IEEE Trans. Electron Devices, vol.ED-40, p.2255, 1993; J. Van Houdt et al., EP501941, published Sept. 1992). As also described in the co-pending applications Ser. Nos. 08/275,016 and 08/080, 225, incorporated herein by reference, a speed-optimized implementation of the HIMOS (High Injection MOS) cell in a 0.7-$\mu$m CMOS technology exhibits a 400 nanoseconds programming time while consuming only a moderate current (~35 $\mu$A/cell) from a 5V supply. This result can be obtained by biasing the device at the maximum gate current, i.e. at a control-gate (CG) voltage ($V_{cg}$) of 1.5V. The corresponding cell area is in the order of 15 $\mu$m$^2$ for a 0.7-$\mu$m embedded Flash memory technology when implemented in a contact-less virtual ground array as described in co-pending application Ser. No. 08/426,685. However, due to the growing demand for higher densities, and also in embedded memory applications like, for example, smart-cards, a continuous increase in array density and the scaling of the supply voltage will become desirable, if not mandatory. This evolution increases the relative impact of bitline voltage drops, and increases the importance of power consumption during programming.

Other references to SSI devices are listed below:

U.S. Pat. No. 5,338,952, issued Aug. 16, 1994, to Y. Yamauchi

U.S. Pat. No. 5,394,360, issued Feb. 28, 1995, to T. Fukumoto

U.S. Pat. No. 5,280,446, issued Jan. 18, 1994, to Y. Y. Ma et al.

U.S. Pat. No. 5,408,115, issued Apr. 18, 1995, to K. T. Chang

U.S. Pat. No. 5,284,784, issued Feb. 8, 1994, to M. H. Manley

U.S. Pat. No. 5,029,130, issued Jul. 2, 1991, to B. Yeh

In contrast to Applicant's device as described in the co-pending applications Ser. Nos. 08/275,016 and 08/080, 225, all these patents describe SSI devices and/or arrays that require complicated processing technologies (Yamauchi, Fukumoto, Ma and Manley use 3 polysilicon layers, while Chang and Yeh use special dielectrics) which presently are cost-effective only for very high-density stand-alone memories. Moreover, the corresponding devices described in the above-mentioned patents aim at maximizing the gate injection current in order to obtain the highest possible programming speed. This is typically done by biasing the select gate at a voltage slightly higher than the threshold voltage of this select channel. For the Applicant's device, as described in U.S. applications Ser. Nos. 08/275,016, 08/080,225 and 08/426,685, the select gate is referred to as Control Gate, and although the function is identical during programming, this select gate is given several names depending on the specific device, as indicated parenthetically in the following discussion. Yamauchi's patent mentions a cell current of 10 $\mu$A for a select gate voltage of 2V (Auxiliary Gate, see FIG. 4). Fukumoto mentions a voltage of 1.5V to be applied to the select gate (Third Gate Electrode or Selection Gate, see col.3, line 39). Ma et al. mention a select gate voltage between 1.5 and 2V (Select Gate 47 in FIG. 4) which corresponds to a cell current of 20 $\mu$A (col.9, line 22). More specifically, it is stated in the corresponding paper by Ma et al. (Symposium on VLSI Technology Digest of Technical Papers, p.49, 1994) that "maximum programmed threshold happens at $V_{sg}$ of 0.6V above Vt(SG)" (col. 2,1$^{st}$ paragraph), where Vt(SG) represents the threshold voltage of the Select Gate SG. This implies that the 'optimum' value for the select gate voltage is 1.8V (see table 1 in the same paper). Similarly, another publication on the same device (Symposium on VLSI Circuits Digest of Technical Papers, p. 77, 1995) mentions that "a low wordline voltage of 1.8V is used during programming to maximize the hot electron injection rate" (col. 2, 3$^{rd}$ paragraph). Chang mentions a typical select gate voltage of between 1 and 2V which corresponds to a cell current in the range of 10–15 µA (Select Gate 14 in FIG. 1a), while Manley prefers a select gate voltage of 1.5V or "a potential just above the threshold voltage of the select transistor (select gate 20 in FIG. 11), since this is the optimum condition for hot-electron injection. . ." (col.4, lines 22–24). Finally, Yeh reports that "a positive voltage level in the vicinity of the threshold voltage of the MOS structure defined by the control gate 29 (on the order of approximately 1 Volt), is applied to the control gate 29" (col.3, lines 46–49).

Thus, all above-mentioned patents mention a select-gate voltage between 1 and 2V, which corresponds to the maximum gate current, and, hence, maximum programming speed. Since for state-of-the-art MOS technologies the threshold voltage of the select channel is definitely smaller than 1V (typically 0.7V for a 0.7-µm technology), all above-mentioned patents still describe a programming scheme which is essentially in the strong inversion or on-state of the MOS structure. This has the advantage that the maximum gate current (and thus the maximum threshold-voltage shift) is obtained and that the gate current is less sensitive to small variations in the select gate voltage (see e.g. the co-pending U.S. applications Ser. Nos. 08/275,016 and 08/080,225, FIG. 4, or U.S. Pat. No. 5,338,952, issued Aug. 16, 1994, to Y. Yamauchi, FIG. 4).

Although in this case the programming cell current is only in the range of 10–50 µA, a further reduction of this parameter will greatly improve the conditions for page-mode application and for supply voltage scaling. Indeed, if the supply voltage is scaled towards 3.3V, the injection efficiency may be increased by increasing the bitline voltage internally on-chip, as already suggested in the co-pending applications 08/275,016 and 08/080,225, p. 17, lines 4–13, and also in U.S. Pat. No. 5,280,446, col.9, lines 19–25. The power that can be delivered from such an on-chip high voltage generator or charge pump is, however, known to be limited in the order of a few µA's (see e.g. U.S. Pat. No. 5,042,009, issued on Aug. 20, 1991, to R. Kazerounian et al.). It is, therefore, still not straightforward to increase the drain voltage internally on-chip for the devices reported in the prior art.

On the other hand, programming a larger number of cells simultaneously (page-mode programming) can reduce the effective programming time per bit considerably. However, the simultaneous programming of, for example, 1024 cells on a common wordline would again require 10–50 mA in the prior art devices, which is unacceptable from the point of view of power consumption and bitline voltage drops, especially if at the same time the drain voltage is to be increased internally on-chip for higher speed performance.

In the present application, these problems are solved and additional interesting features are demonstrated by optimizing the programming operation from the point of view of power consumption and page-mode programming speed, in contrast to the prior art which shows optimum solutions only from the point of view of programming speed per cell.

SUMMARY OF THE INVENTION

The present invention is a method for programming SSI cells or an array of said cells. The method achieves very fast programming while consuming only a very small amount of power, which paves the way for new applications such as battery-operated systems, page-mode programming for very high data throughput. The method also allows for the bitline voltage to be increased internally on the chip in order to circumvent the efficiency decrease associated with supply voltage scaling. By exploring the SSI mechanism in the subthreshold regime, an optimum value for the CG voltage is found for which the gate current is no longer maximized, but the energy consumed from the power supply is minimized and the injection efficiency during programming is maximized. The programming of a memory cell in this regime, where the gate current is a very steep function of the CG voltage, is, however, still achieved in a few microseconds while consuming only a very small cell current in the range of nA's. This allows an entire wordline in the array to be programmed simultaneously, even if the supply voltage is scaled down to 3.3V or below. This possibility, combined with a physical programming time per cell which is still very short, realizes an effective programming time in the order of 20 ns/byte for a 1 Mbit device, which corresponds to a maximum programming transfer rate of 50 Mbyte/s. State-of-the-art Flash memories typically show a transfer rate in the order of 20–300 Kbyte/s during programming which is 2 to 3 orders of magnitude slower than in the case of the present invention (see e.g. A. Bergemont Proceedings of the European Solid-State Device Research Conference, Leuven 1993, p.577, table 1). Therefore, the method of the present invention with the accompanying programming scheme represents a substantial improvement in terms of high-speed-oriented as well as low-power-oriented applications. It is important to mention here that optimizing the injection efficiency instead of the gate current itself, is not a straightforward solution for next generation Flash memories, since the gate current is much more difficult to control due to the steepness of the subthreshold characteristic of the MOS device.

It is another object of the present invention to disclose a novel negative-gate-bias erase scheme which allows the reduction of the magnitude of the erase voltage from −12V (J. Van Houdt et al., IEEE Trans. Electron Devices, Vol.ED-40, p.2255, 1993) to −7V and below for a 0.7-µm CMOS technology without any erase time penalty. This low-voltage erase scheme allows the reduction of the internally generated negative erase voltage which enhances reliability margins and which further decreases the development entry cost for implementing the HIMOS concept in an existing CMOS baseline process. These objects, as well as other objects, features, and advantages of the present invention, are apparent in the following Detailed Description of the Preferred Embodiments.

The present invention allows for low-voltage operation on-chip and furthermore reduces the additional cost of incorporating the resulting Flash array in a CMOS (Complementary Metal-Oxide-Semiconductor) process flow. The latter is particularly important for so-called embedded memory applications where the Flash process modules have to be economically reconciled with an already existing CMOS baseline process for fabricating chips that contain large amounts of digital or analog functions as well as Flash memory, such as, e.g., smart cards.

The present invention also provides a method of programming a nonvolatile memory cell integrated on a chip in a metal-oxide-semiconductor technology by using a control gate voltage that is less than the threshold voltage of the control channel, and that also results in high injection efficiency. The gate voltage can be less than 1 Volt, or even less than 0.7 Volt. A relatively high voltage is applied to the program gates to couple a voltage to the floating gate, and a voltage equal to or higher than the supply voltage of the chip is applied to the drain region. The diffusion current which flows from the source to the floating gate is in the order of nanoamperes.

The supply voltage is typically 5 Volt for a 1.25 μm or 0.7 μm CMOS technology.

The present invention also allows for the programming of an array of cells containing a number of rows of cells having interconnected control gates to form a wordline. Again, a relatively high voltage is applied to the program gates to couple a voltage to the floating gate, and a voltage equal to or higher than the supply voltage of the chip is applied to the drain region. Additionally, a low voltage is applied to the wordline, the low voltage being smaller than or equal to the threshold voltage of the control-gate channel. This causes a current to flow from the source regions of the cells towards the floating-gate channels of the cells to achieve simultaneous programming of the memory cells on that particular wordline.

The invention also provides a method of erasing an array or part of an array of nonvolatile memory cells. A negative voltage in the order of −7 Volt is applied simultaneously to one or more program lines and to one or more wordlines. This couples a negative voltage to the floating gates of the cells that are connected to said program lines and said wordlines. The method of erasure utilizes a tunneling current of electrons from the floating gates of the cells towards the substrate of the cells, without the need for high negative voltages. In an embodiment of the present invention, the method of erasure also avoids a high power consumption from the supply voltage.

Additionally, a voltage at least as high as the supply voltage applied to the drain regions of the cells causes a tunneling current of electrons to flow from the floating gates of the cells towards the substrate of the cells and/or to the drain regions of the cells to achieve simultaneous erasure of the memory cells that are connected to a wordline and a program line. Again, this is without the need for high negative voltages and optionally without the need for high power consumption. Of course, the negative voltage applied to the program lines/worlines can be, and preferably is, generated on chip. This has the advantage of not requiring an additional external supply voltage, unlike many of the prior art nonvolatile memory devices.

BRIEF DESCRIPTION OF THE DRAWINGS

A preferred embodiment of the present invention is described herein with reference to the drawings wherein.

DETAILED DESCRIPTION OF THE PREFERRED EMBODIMENTS

Exemplary devices have been fabricated in a 0.7 μm nonvolatile technology embedded in a CMOS technology. The fabrication of these devices comprises the steps of R field implantation and the a thin oxide (7–9 nm) under the floating gate. The interpoly dielectric is a polyoxide of thickness 25–30 nm, and the oxide between the control gate and the channel region is 15 nm. The length of the floating gate is 0.7 μm, the length of the control gate is 1.0 μm, and the overall cell size is 13–15 μm$^2$.

The method as disclosed in the present application can also be applied to a 1.25 μm nonvolatile technology embedded in a CMOS technology or in a 0.5 μm nonvolatile technology embedded in a CMOS technology or in a 0.35 μm or smaller gate length nonvolatile technology embedded in a CMOS technology.

The term "supply voltage" is well understood by one of ordinary skill in the art. The term "supply voltage" is often understood to be any external voltage that delivers the power to make an electronic circuit operate. By preference the "supply voltage" of a chip including nonvolatile memory cells is the voltage used to supply the power to any logic circuit fabricated in the CMOS technology in which the nonvolatile memory cells are incorporated. For the 0.7 µm nonvolatile memory technology as disclosed in the related applications, the supply voltage is 5 Volt. Any externally applied voltage other than the supply voltage defined above will be referred to herein simply as an "external voltage".

A voltage that is outside the range between the supply voltage and ground and only needs to deliver a limited amount of current is typically generated by charge pumps incorporated on the chip.

The Subthreshold Source-Side Injection (or $S^3I$) Mechanism

Figure 1:
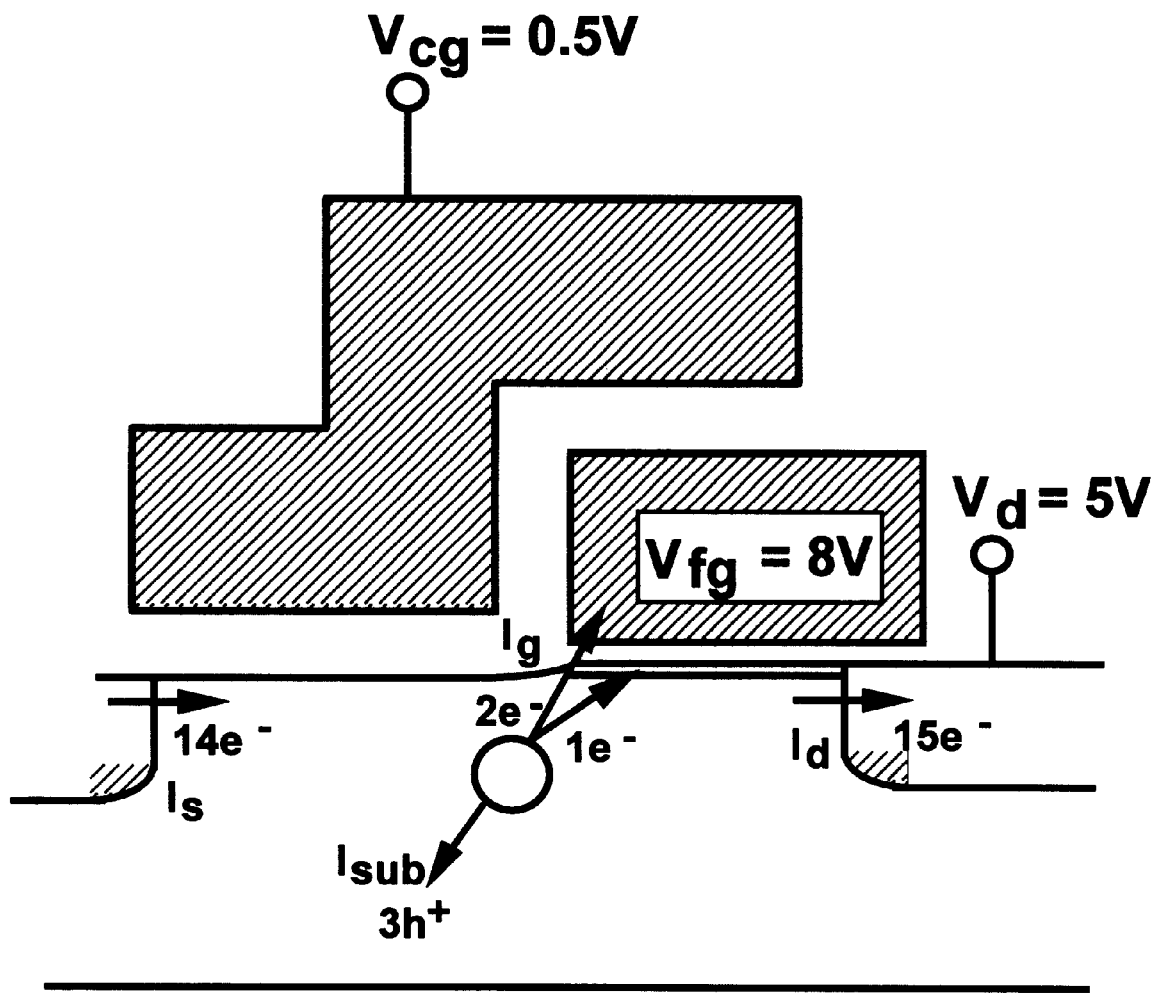
FIG. 1 shows a cross-section of a memory cell and the corresponding current components under Subthreshold Source-Side Injection ($S^3I$) conditions.
Figure 2:
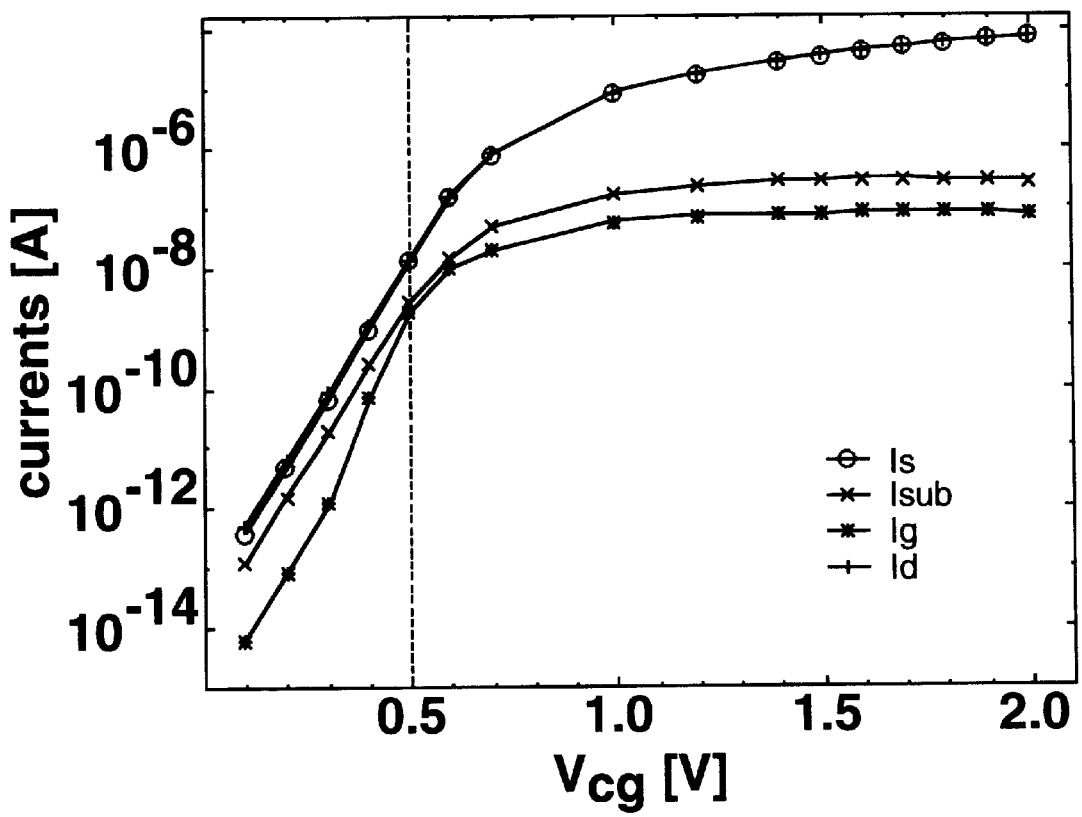
FIG. 2 shows the current components for the set-up of FIG. 1. As an example, the Control-Gate voltage $V_{cg}$ is set to 0.5V.

In order to further reduce the power consumption during Flash programming, a novel scheme is presented which relies on the appearance of high-efficiency SSI in the subthreshold regime of the memory cell. FIG. 1 shows a symbolic cross-section of a split-gate device which is used to trigger the SSI mechanism (see also the co-pending applications 08/275,016, 08/080,225, FIG. 2 and 08/426,685, FIG. 5), where the control gate (CG) 2 and the floating gate (FG) 4 are indicated, while the external program gate (PG) is left out for clarity. According to the copending applications 08/275,016, 08/080,225, and 08/426,685, this external PG is necessary to couple a high voltage in the order of 8V onto the floating gate 2. FIG. 1 also illustrates the different current components that play a role inside the device. Their relative values at a CG voltage of 0.5V, a drain voltage of 5V and a floating-gate (FG) voltage of 8V are indicated in terms of a number of electrons, traveling inside the device from a low to a higher potential. FIG. 2 shows all these current components (gate current $I_g$, source current $I_s$, drain current $I_d$ and substrate current $I_{sub}$) as a function of $V_{cg}$. The gate current has been determined indirectly from a programming characteristic in order to rule out trapping effects by a procedure as described by J. Van Houdt et al. in IEEE Trans. Electron Devices, vol.ED-40, p.2255, 1993. The above referenced procedure is necessary since the direct measurement of the gate current yields a very inaccurate result due to the discrepancy between the stress time associated with a DC gate current measurement and the programming time of the cell, as described in the above-mentioned publication (see in particular FIG. 5). The other current components have been measured directly on an equivalent cell with a contact attached to the floating gate in order to accurately control the floating-gate potential. Also for these measurements, the use of state-of-the art equipment with a very high accuracy and low leakage is desired because of the very small current levels to be detected. If these precautions are not taken, the obtained injection efficiency is highly questionable, since this parameter corresponds to the ratio of two almost-zero currents.

Because all currents are in the same (small) order of magnitude in the subthreshold regime, the following Kirchoff balance has to be taken rigorously into account:

$$I_s + I_{sub} = I_d + I_g \quad (1)$$

This is illustrated for $V_{cg}$=0.5V: for every fourteen electrons traveling from the source to the weak-gate-control region between CG 2 and FG 4, three electron-hole pairs are generated through impact ionization. The three holes are collected at the substrate (or well), while two electrons are injected onto the FG 2. The remaining electron is collected at the drain which makes the total number of collected drain electrons equal to fifteen.

Figure 3:
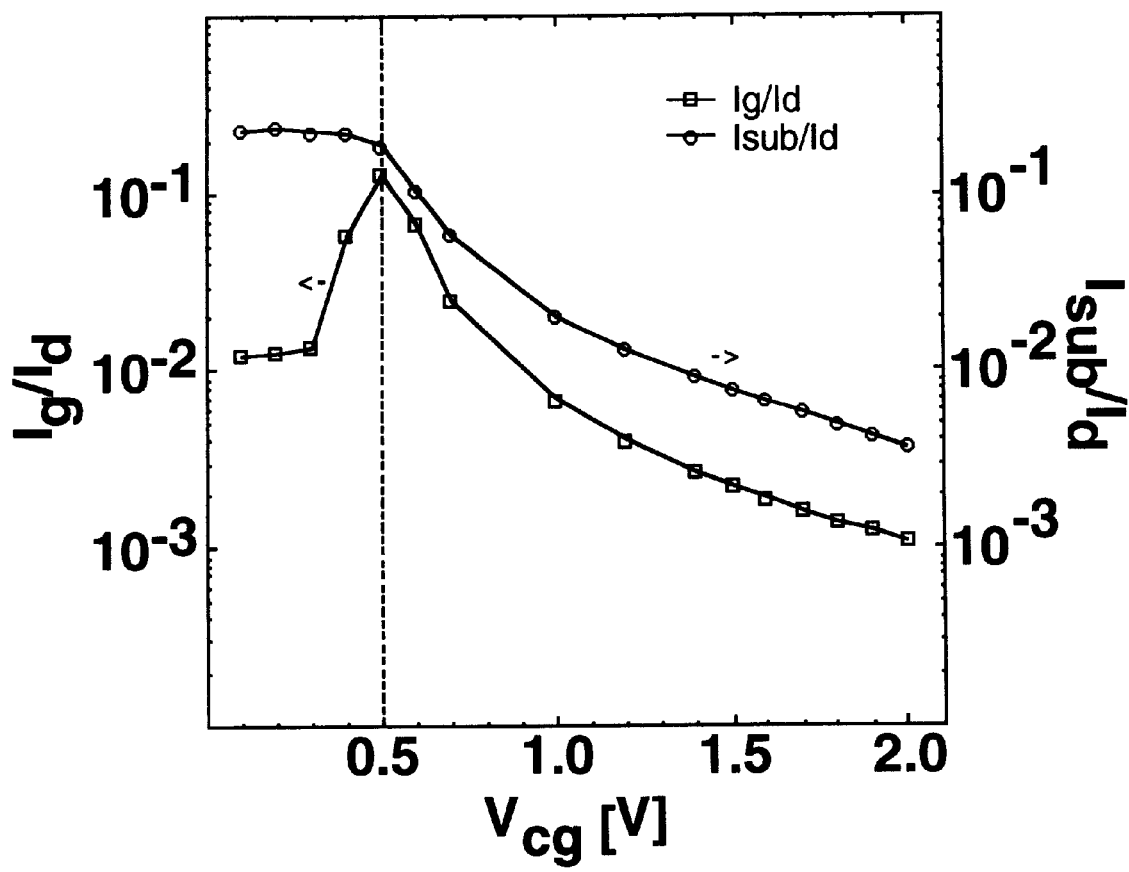
FIG. 3 shows the ratio of the gate current and the drain current and the ratio of the substrate current and the drain current, respectively, as a function of the Control-Gate voltage $V_{cg}$ for the set-up of FIG. 1.

The initial injection efficiency $I_g/I_d$ and multiplication factor $I_{sub}/I_d$ at the start of the programming operation are calculated and plotted as a function of $V_{cg}$ in FIG. 3. An optimum for the injection efficiency is found at $V_{cg}$=0.5V or about 0.2V below the threshold voltage of the CG channel. For these conditions, the relative values of the current components are already shown on FIG. 1. It is concluded that 13% of the consumed drain current of 15 nA is injected on the floating gate, which corresponds to an extremely high injection efficiency of ⅛ at the start of the programming operation. At such low current levels, an entire wordline is easily programmed with one gate pulse, and, moreover, the drain voltage can be easily increased on-chip for scaled-down technologies. This is not possible in previously disclosed memory arrays in the prior art, since the channel current is then still in the order of several tens of µA's, which corresponds to the strong inversion regime. In the present invention, however, the channel current which is flowing from the source junction towards the floating-gate channel is essentially an extremely small diffusion current since the MOS channel underneath the CG is in the off-state, according to the classical MOS theory as described in the prior art (see e.g. S. M. Sze, Physics of Semiconductor Devices, $2^{nd}$ Edition, Ed. John Wiley & Sons, 1981).

Figure 4:
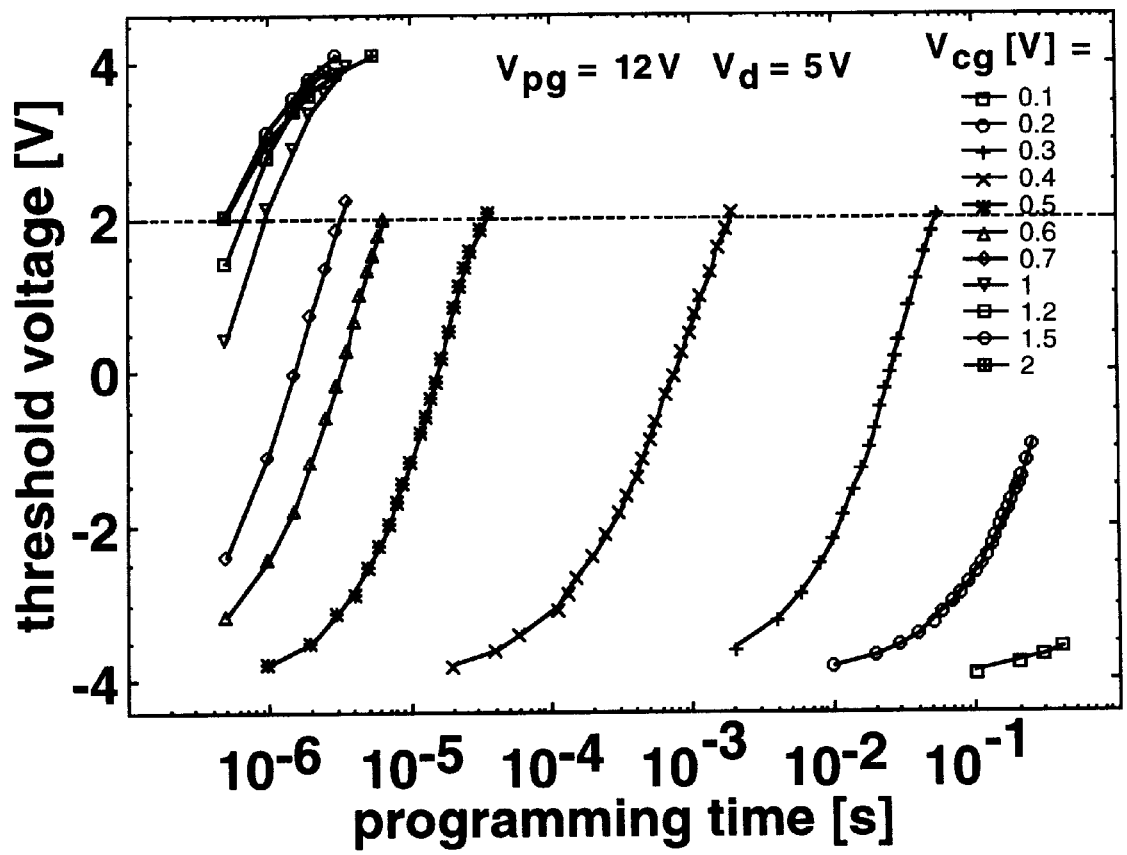
FIG. 4 shows the transient programming characteristics for the memory cell of FIG. 1 and for a program-gate voltage $V_{pg}$ of 12V, a drain voltage of 5V, and for different values of the control-gate voltage $V_{cg}$.

FIG. 4 shows the transient programming characteristics for a PG voltage of 12V, a drain voltage of 5V, and for different CG voltages in the range of 0.1–2V. It is clear that the fastest programming operation is obtained for CG voltages of 1–2V and, that the programming speed is rapidly decreasing for lower CG voltages (<1V). However, the data of FIG. 3 show that the injection efficiency is still increasing in this region and is only maximized for a CG voltage as low as 0.5V, the latter value being well below the threshold voltage of the CG channel which is 0.7V in the present case. In fact, measurements on similar memory cells which had a CG threshold voltage of only 0.5V, showed a maximum injection efficiency for a CG voltage of only 0.3V, indicating that the optimum value is systematically about 200 mV below this CG threshold voltage.

Figure 5:
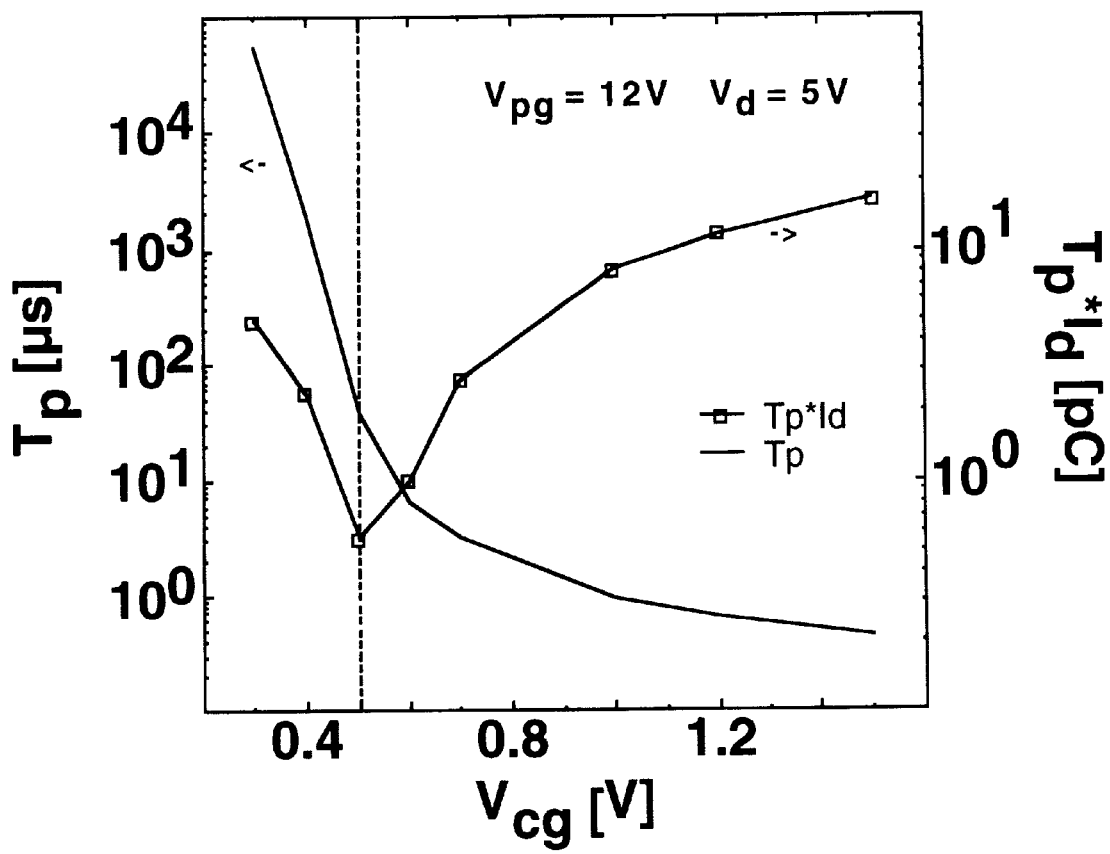
FIG. 5 shows the programnming time $T_p$ and its product with the corresponding drain current $T_p \times I_{dprog}$ versus the control-gate voltage $V_{cg}$ for a program gate voltage $V_{pg}$ of 12V and a drain voltage $V_d$ of 5V.

In order to analyze these observations, FIG. 5 shows the programming time which is defined as the time necessary to obtain a threshold-voltage shift from -4V to +2V, and the product of the programming time with the corresponding drain current. This product is minimized at a CG voltage of 0.5V.

Figure 6:
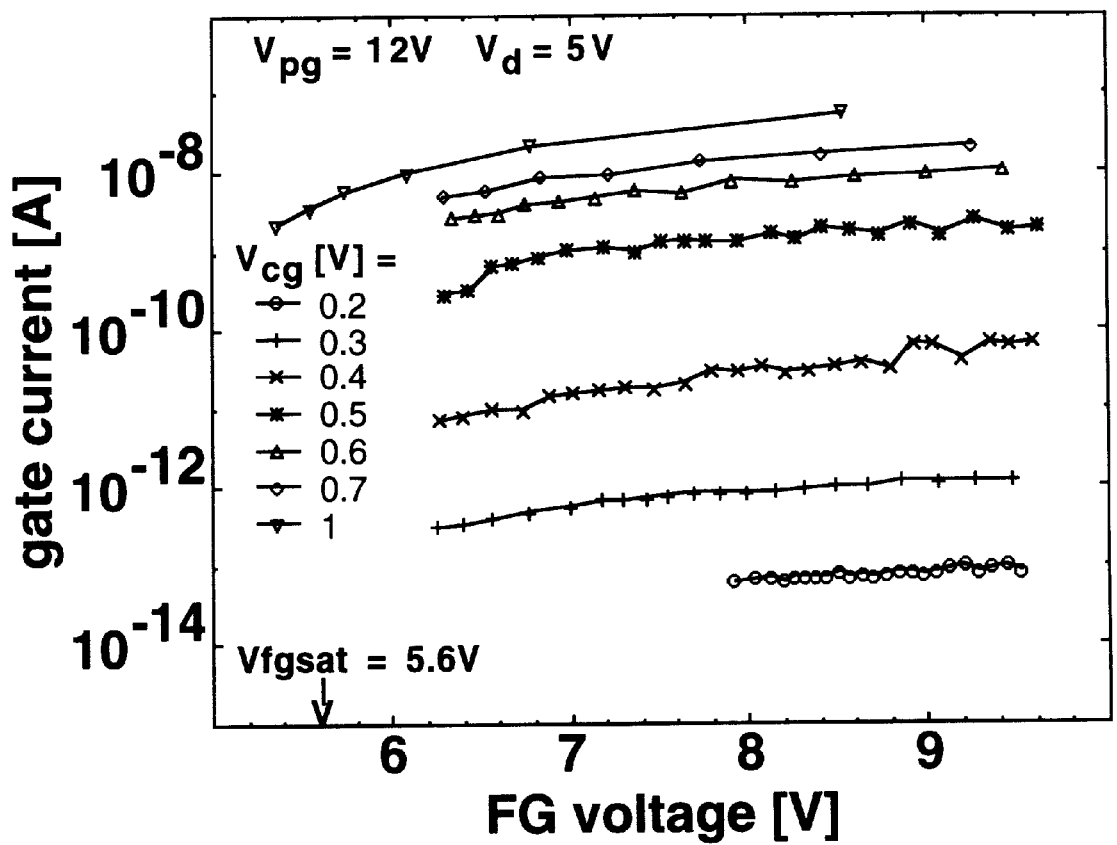
FIG. 6 shows the gate current versus the floating-gate voltage $V_{fg}$ as derived from the transient programming characteristics of FIG. 4, for 12V at the program gate and 5V at the drain, and for different values of the control-gate voltage $V_{cg}$.

This can be explained as follows: because the programming time $T_p$ is inversely proportional to the average gate current over the programming window, the product $T_p \times I_d$ is inversely proportional to the average injection efficiency. Moreover, this parameter is a direct measure for the energy $E_p$ required to program a single cell at that particular CG voltage:

$$E_p = V_{supply} \times Q_{supply} = V_{supply} \times \int_0^{T_p} I_d \, dt = V_{supply} \times T_p \times I_d \quad (2)$$

where $V_{supply}$ and $Q_{supply}$ refer to the supply (or bitline) voltage and the charge consumed from the voltage supply, respectively. The last step in Eq.(2) is justified since the drain current is a constant during programming in the case of most SSI devices as explained by J. Van Houdt et al. in IEEE Trans. Electron Devices, vol.ED-40, p.2255, 1993, and in the co-pending applications 08/275,016 and 08/080, 225, p. 17, lines 1–4. Applications of $S^3I$ Extremely low-power, highly linear programming versus high programming transfer rate FIGS. 3 to 5 thus imply that although ultra-fast programming is only obtained for CG voltages between 1 and 2V, the optimum value in terms of power consumption is a CG voltage below threshold (in this particular case 0.5V). In this case, the 256 cells connected to the same wordline of a 64 kbit (256×256) device can be programmed simultaneously in 35μs consuming only 4 μA. The ratio of injected floating-gate charge over consumed charge from the bitline is then equal to 7%. This implies that the average injection efficiency over the programming window is less than a factor of 2 smaller than the initial value, indicating that Subthreshold SSI (S³I) almost acts as a current source during programming. FIG. 6 confirms this by showing the calculated gate current versus floating-gate voltage characteristics for different values of the CG voltage. For CG voltages in the high gate current regime (1–2V), these characteristics still show a significant gate-current increase with increasing FG voltage, which implies that the final gate current at the end of a programming operation is considerably smaller than its initial value. However, for small CG voltages (≦0.7V), the gate current becomes more constant as a function of the FG voltage, which implies a current-source-like behavior: the gate current is almost constant during the entire programming operation. This is an interesting and unique property for nonvolatile memory devices, because an eventual increase in the margins on the programmed threshold level (e.g. due to retention requirements, high temperature operability, disturb conditions, etc.), only marginally influences the programming time. On the other hand, the coupling ratio can be considerably reduced, since the programming speed remains high, as long as the final value of the FG voltage during programming stays above a certain level, indicated as $V_{fgsat}$ in FIG. 6. This is in contrast to tunneling-based and CHEI-based devices which show a large dependence of the programming time on the programmed-$V_t$ margins, and on the gate coupling factor. It is also in contrast to e.g. U.S. patent Ser. No. 5,029,130, where the supply of carriers is counteracted by the programming operation itself, which eventually stops the programming due to a correspondingly steep decrease in gate current (see U.S. Pat. No. 5,029,130, col.3, lines 62–68).

Figure 7:
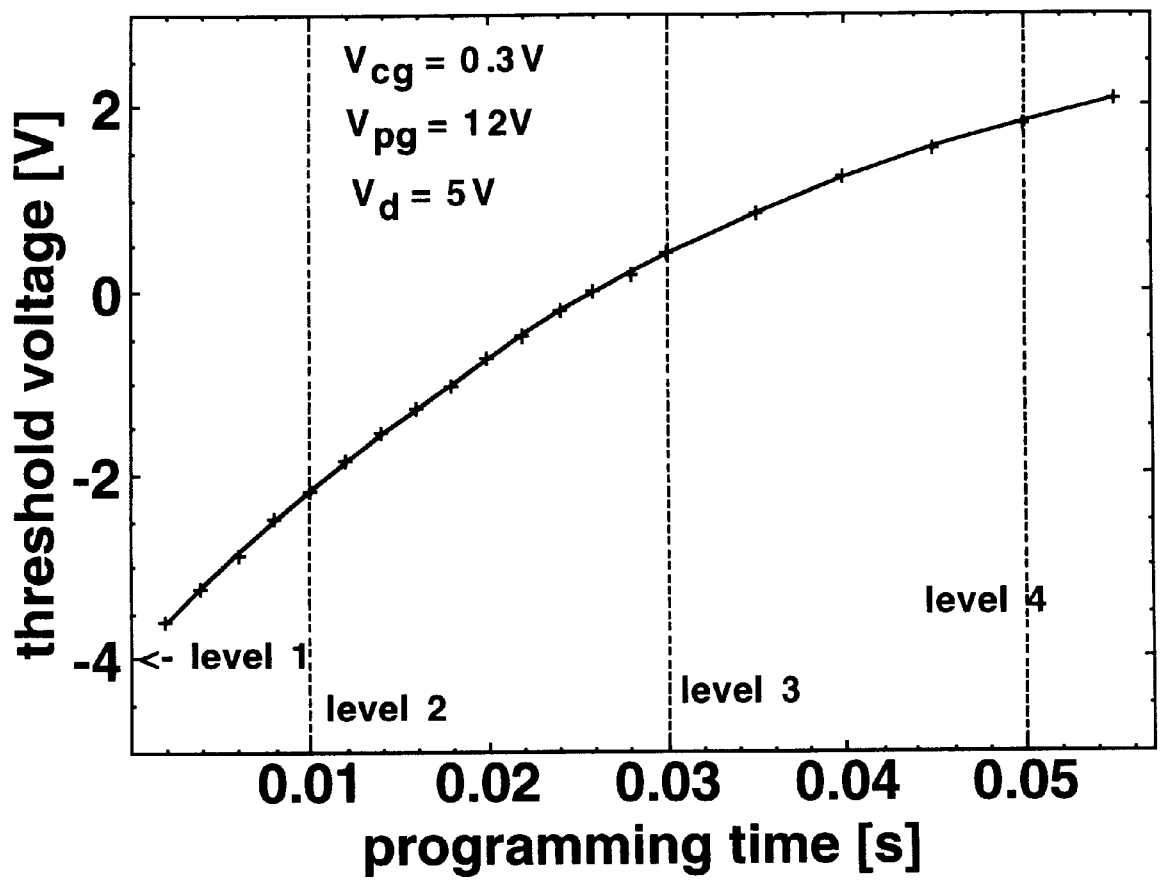
FIG. 7 shows the transient programming characteristic for $V_{cg}$=0.3V taken from FIG. 4 but displayed on a linear time scale. The linearity of the characteristic can be exploited for multilevel storage as indicated by the dotted lines.

Finally, multi-level programming for mass storage becomes very attractive because the obtained threshold-voltage shift is almost proportional to the width of the applied programming pulse. FIG. 7 shows the transient programming characteristic for $V_{cg}$=0.3V taken from FIG. 4 but displayed on a linear time scale. It is clear that the threshold-voltage shift is almost a linear function of time, which means that a plurality of pulse widths which are a multiple of a basic time step can provide almost equally spaced threshold voltage levels or charge levels on the FG if applied to the PG with a fixed amplitude. Certainly the pulses could be arranged to all be of the same duration, and have different amplitudes; however, due to the linear characteristics, the preferred embodiment utilizes pulses of nearly equal amplitude and different durations. This can be utilized for efficient multilevel storage of data in the corresponding memory array: if 2 intermediate charge levels are added to the conventional two (programmed and erased level), 2 bits of information can be stored inside one memory cell which doubles the capacity of the memory array for the same silicon area. This principle is, however, generally applicable to $2^n$ charge levels corresponding to n bits of information. Although this multilevel application is already interesting for the case of maximum gate current, it becomes much easier to control in the case of subthreshold SSI since the linearity is much better.

Another feature of the invention is that the very small channel current that is needed to program a memory cell by S³I, also implies very small internal voltage drops inside the memory array. In fact, the very small current will cause the potential at the split point to be equal to the externally applied drain voltage with a very high accuracy (see also the co-pending applications 08/275,016 and 08/080,225, p.6, lines 14–17). Therefore, the entire drain voltage is available for the hot-electron generation process, since no significant voltage drop is appearing inside the FG channel. This is in strong contrast to e.g. the case of U.S. Pat. No. 5,029,130, issued Jul. 2, 1991, to B. Yeh, where the potential drop, which is available for hot-electron generation, is only a fraction of the applied drain voltage.

Evidently, the same argument holds also for the voltage drop across the bitline that connects the drain junctions of the cells that share a common column (see also the co-pending application Ser. No. 08/426,685): it is clear that a smaller channel current is beneficial for the effective drain voltage, especially in contactless arrays such as those used for the HIMOS cell, as described in the co-pending application Ser. No. 08/426,685, since these arrays suffer from a relatively high parasitic bitline resistance. This is due to the buried junction concept which avoids contacts but also inhibits silicidation of the entire bitline for improving the bitline sheet resistance. Moreover, when scaling the voltage down to 3.3V and below, an eventual loss in bitline voltage due to parasitic resistance will have an even larger influence on the hot-electron injection efficiency. Finally, the uniformity of the programmmed threshold levels is improved if the voltage drops can be substantially reduced or canceled out, since then all cells will be programmed by the same bitline voltage, independent of their position along the bitline or their distance from the nearest contact to metal. These arguments clearly illustrate the major importance of a substantial decrease in consumed current from the supply voltage, for reasons of power reduction as well as for reasons of scalability.

Another feature of the invention is the ability to optimize the programming transfer rate of the memory array, i.e. the number of bytes that can be transferred per second towards the array during programming. Due to the above-described low-power programming mechanism, a number of cells that are on the same wordline can be programmed simultaneously, thereby reducing the effective programming time per byte in high-speed applications. This allows a higher transfer rate of the data to be programmed, provided that registers are provided on-chip to collect these data before programming. The designs of such registers are well-known to one skilled in the art.

Considering again the case of a CG voltage of 0.5V, it has already been mentioned that the cell is then programmed in 35 μs. If an entire wordline of a square 1Mbit memory, which consists of 1,024 memory cells, is programmed under these conditions, the effective programming time becomes 35 μs/128 bytes or 270 ns/byte. The corresponding current consumption from the bitline is in the order of 15 μA. This result can, however, be significantly improved by trading energy consumption for speed: although Eq.(2) has illustrated that the optimum CG voltage for energy consumption is 0.5V, a higher CG voltage may give a much higher programming transfer rate. Assuming a CG voltage of 0.7V (which is the threshold voltage of the CG channel) instead, the considered wordline of the same 1 Mbit memory can be programmed in only 3 μs, while consuming less than 1 μA/cell. This already implies an effective programming time (or transfer rate) of 25 ns/byte for a total current consumption of less than 1 mA. In other words, increasing the CG voltage to a value well above the optimum for low-power operation (which is about 200 mV below the CG threshold voltage as shown on FIG. 5), can provide a considerable gain in effective programming speed without compromising the power consumption and the corresponding voltage drops. A similar calculation for memory devices that have a CG threshold voltage of only 0.5V shows that 16 ns/byte can be obtained for the same example if $V_{cg} \approx V_{t(cG)}$. Also in that case, current consumption is limited below 1 mA.

If in a particular application, minimization of power consumption is not that important after all, one may even consider further increasing the CG voltage to approximately 1V. In that case, the data from FIG. 5 provide a 7 ns/byte transfer rate which requires about 8 mA for a 1024×1024 array. It should be noted that programming of only 1 byte utilizing the conventional CHEI mechanism also consumes about 8 mA (Y. Miyawaki et al., IEEE J. Solid-State Circuits, vol. 27, p.583, 1992). In view of the previous paragraph, it is important to note that 8 mA of current consumption is only distributed over 8 bitlines in the CHEI case, while the above-mentioned $S^3I$ conditions correspond to 8 mA distributed over 1024 bitlines which largely relaxes the constraints on bitline voltage drops with respect to the CHEI case. This is a primary reason why the conventional CHEI devices require a NOR configuration with ½ metal-diffusion contact per cell in order to reduce the bitline voltage drop (see also the co-pending application Ser. No. 08/426,685, FIG. 2 and last paragraph of p.4).

It can be concluded that:
(1) a CG voltage which is about 200 mV below the threshold voltage of the CG channel provides the smallest possible energy consumption, which is most interesting for battery-operated and wireless applications,
(2) a CG voltage in the vicinity of the CG threshold voltage can provide the highest possible data transfer rate in high-speed applications, while still requiring a relatively small power consumption.

Application to a memory array

Figure 8:
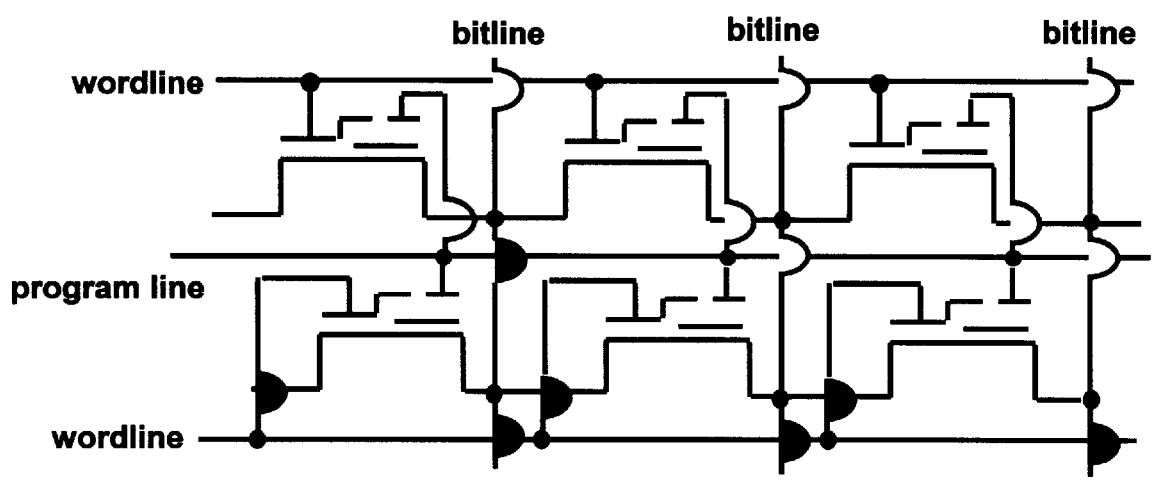
FIG. 8 shows an exemplary embodiment of the memory cell array for the case of a virtual ground configuration with shared program lines (see also the co-pending application Ser. No. 08/426,685, filed Apr. 21, 1995, FIG. 11).
Figure 11:
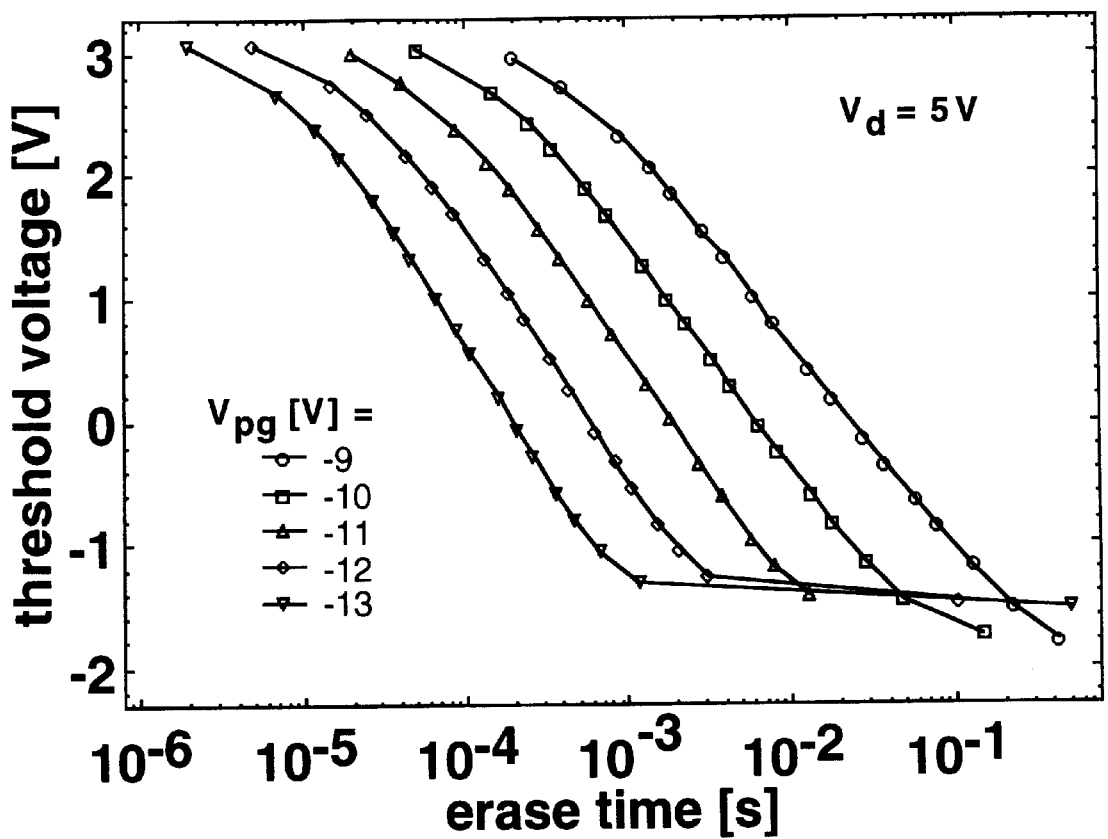
FIG. 11 shows the erase characteristics associated with the scheme of FIG. 10.

FIG. 8 shows a typical embodiment of a memory array utilizing this programming mechanism. This figure is identical to FIG. 11 disclosed in the co-pending application 08/426,685, but the following procedure is also applicable to all other embodiments disclosed in said reference. By sharing the program gates of two adjacent rows of memory cells in one single horizontal program line 6, and by simultaneously sharing the diffusion lines 8 (connected to the source and the drain junctions of the cells) between adjacent columns, a very compact array is achieved which allows the cell size to be reduced to 15 $\mu m^2$ in a 0.7-$\mu m$ double polysilicon CMOS process, see co-pending applications 08/275,016, 08/080,225, and 08/426,685. For programming the cells in such an array according to the present invention, a high voltage that is generated on-chip from a charge pump (typically 10–12V) is applied to the program line 6, a moderate voltage, which is either equal to the external supply voltage (typically 3.3 or 5V), or is generated on-chip from a charge pump (typically 4–5V if 3.3V is the external supply voltage), is applied to the bitline 8, and a low voltage, less than or equal to the threshold voltage of the CG channel, is applied to the wordline 10. The latter voltage has to be optimized in terms of the considered application: e.g. for battery-powered applications the consumed energy is the main issue and the optimum is typically 200 mV below the threshold voltage of the CG channel, as explained above (see Eq.(2)).

Reliability aspects

The feasibility of this mechanism for application in low-power Flash memory and the corresponding reliability relies on an accurate control of the $S^3I$ current. Therefore, the CG voltage is to be generated on-chip by an appropriate circuit that is almost insensitive to process variations. A relatively easy solution, which is generally known in the prior art, could consist of a resistive divider comprising 10 identical resistors close to one another which divide the supply voltage into 10 equal parts. For a 5V supply this would result in multiples of 500 mV, the first one being the optimum value for low-power programming. Since the impact of eventual processing variations (from chip to chip, wafer to wafer, etc.) is identical for these 10 resistors, such a simple divider circuit is fairly insensitive to these variations. On the other hand, if the supply voltage of 5V shows a variation of 10%, the 500mV node of the divider will only show the same relative variation, i.e. 500 mV±50 mV, which is acceptable for providing sufficient design margins. These and other circuits (such as bipolar references) are well-known in the state of the art and can be directly used for an accurate generation of the low CG voltage on-chip.

Secondly, the uniformity of the threshold voltage of the CG channel is preferably well-controlled over the wafer, since the $S^3I$ current is essentially a function of the difference between the applied CG voltage and this threshold voltage. This requirement can be easily fulfilled in the case of the HIMOS cell, since the CG channel is identical to the n-type MOS transistor of the corresponding CMOS process. This MOS device has to be well-controlled for other purposes, such that a very sharp distribution is usually obtained. A typical value for a wafer fabricated in Applicant's 0.7-$\mu m$ technology is 0.660±0.005V, which provides sufficient controlability.

Figure 9:
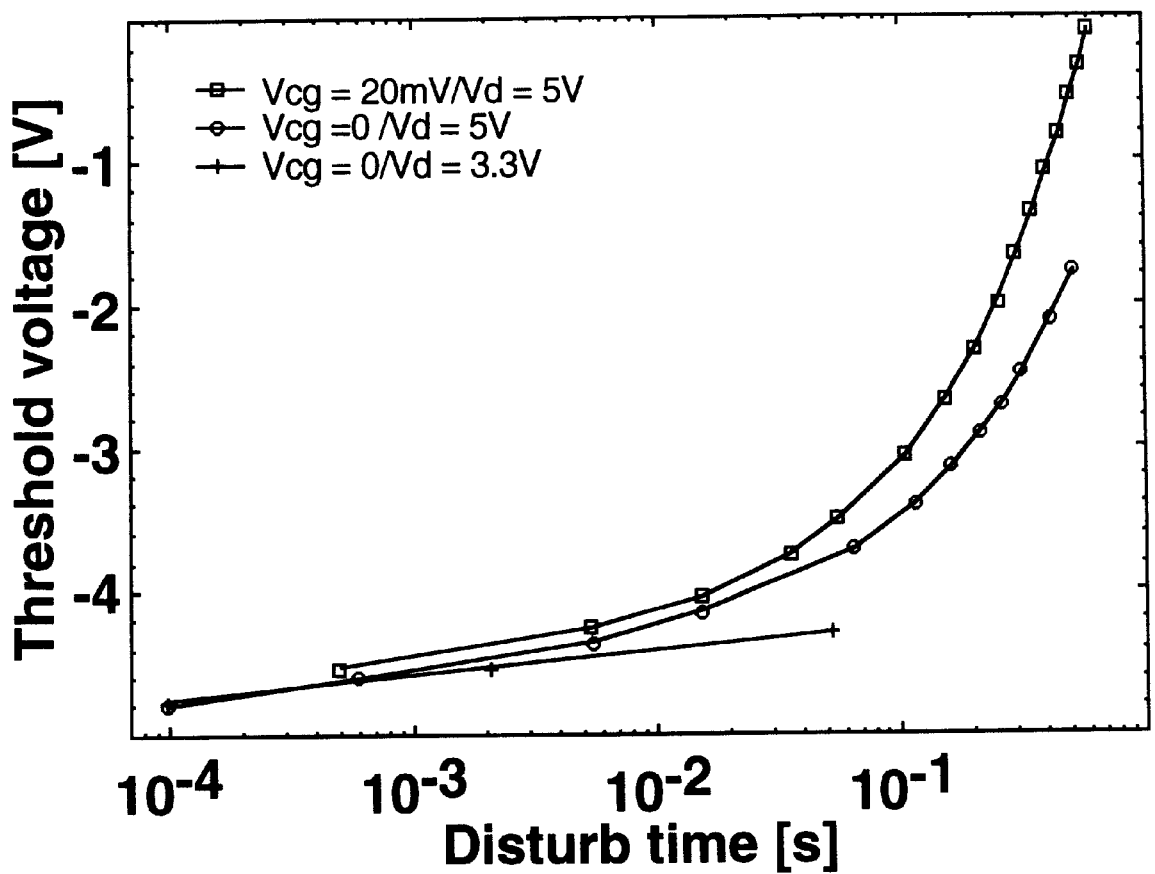
FIG. 9 illustrates the $S^3I$ disturb characteristics for a nearly-zero voltage at the control gate, a program gate voltage of 12 Volt, and different drain voltages.

A last issue to be addressed is the novel gate disturb effect that could arise from this highly efficient injection mechanism under nearly-zero CG voltage conditions. Indeed, due to the efficient injection continuing even at very low gate voltages (~0.3V), the cells in FIG. 8 that are sharing its program line with the device(s) being programmed could also exhibit an (unwanted) threshold-voltage shift. The corresponding disturb characteristic for the worst case condition of a CG threshold voltage of only 0.5V is shown on FIG 9. It is found that the disturb effect, although different from zero, is still very acceptable since the programming time at a CG voltage of 0.5V is only a few $\mu s$ in this case. The total disturb time which is given as the product of this programming time and the number of words connected to the same program line is always short enough in order not to program a particular row unintentionally. On the other hand, it has been checked through circuit simulation that a proper decoder design as known to anyone skilled in the art is able to guarantee that the CG voltage on the unselected wordlines will always stay close to the ground potential in a practical situation, even in transient regime. In fact, from the data presented in FIGS. 4 and 5, it can be easily derived that a difference in CG voltage of only 200 mV suffices in order to establish the necessary margin between programnming and disturb immunity.

However, indirectly, other gate disturb mechanisms initiated by the high program gate voltage, such as tunneling from the substrate to the FG in the erased state and interpoly leakage from the FG to the PG in the programmed state, can be of relatively high importance due to the increase of the physical programming time in the low-power regime. Although several solutions to this problem have already been suggested in the paper by Van Houdt et al. published in the Proceedings of the European Solid-State Device Research Conference 1995, p. 553, the problem could impose additional restrictions on the technology (minimum tunnel oxide thickness), array density (number of words on a wordline) etc. Again, the solution depends on the particular application: e.g. because of the very low power consumption during programming, all cells on the same wordline can be programmed simultaneously (so-called page-mode programming) resulting in a very short disturb time which is equal to the programming time of the cell. Moreover, if the sharing of the program line is no longer maintained, the disturb effect will even disappear completely. In these applications where maximum programming data throughput is envisaged, the disturb effect is almost completely canceled out 'automatically'. In applications that do not aim at the page-mode option, the problem of the increased disturb effects can be controlled by increasing the CG voltage, for example, to 0.7V or above depending on the required array density. The latter solution illustrates once more in an exemplary manner that the optimum value of the CG voltage in practice depends on a variety of factors, which relative importance depends on the envisaged application and/or the technological boundary conditions.

Therefore, it can be concluded from this detailed analysis that adequate disturb margins are feasible for the $S^3I$ programming scheme.

Low voltage erase scheme

Another important feature of this invention is a novel erase scheme that allows a significant reduction of the negative gate bias necessary for Flash erase. Especially for embedded memory applications where the minimization of the impact of the memory technology on the surrounding CMOS circuits is a prime issue, the reduction of the negative erase voltage is of major importance. Furthermore, a voltage reduction also simplifies the design of the high voltage generating and switching circuitry, and increases reliability margins for the entire process.

Figure 10:
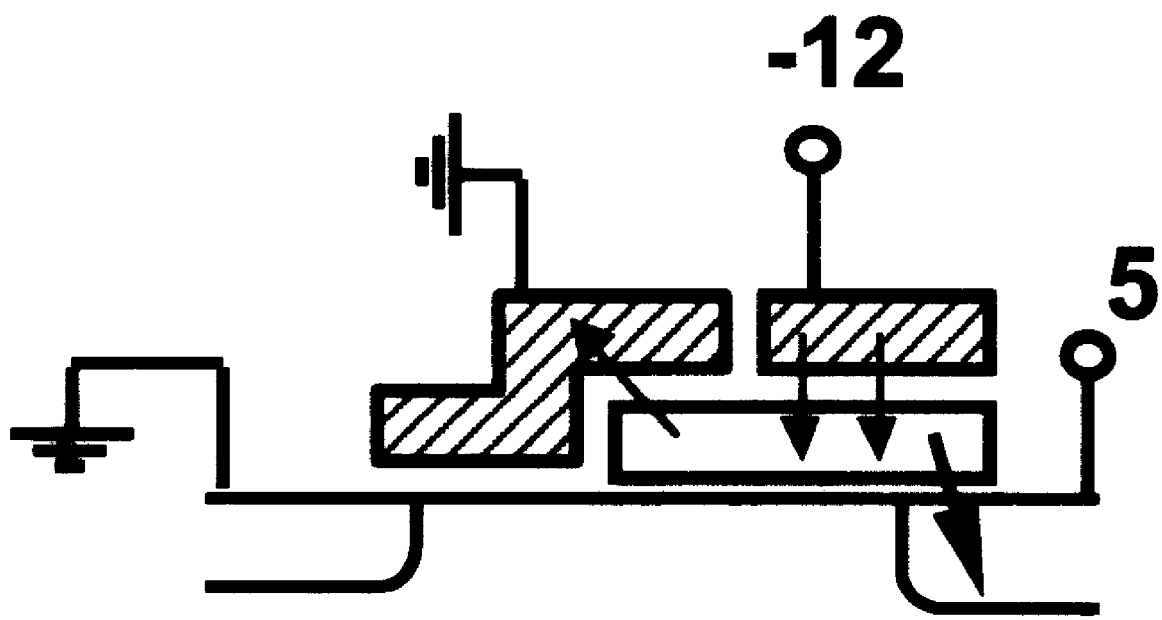
FIG. 10 shows the previously used erase scheme with grounded control gate.

FIG. 10 shows a schematic of the previously used negative-gate-bias erase scheme where the CG 12 is grounded and the negative voltage is applied only to the PG 14 for inducing a high oxide field between the FG 16 and the drain junction 18. In this case, the voltage across the tunnel oxide between the FG and the drain is approximately given by the following equation:

$$|V_{fg}-V_d| \approx p(V_t-V_{pg})+(1-d)V_d \qquad (3)$$

where $V_{pg}$, $V_{fg}$ and $V_d$ are the PG voltage, the FG voltage and the drain voltage during erasure, respectively, $V_t$ is the threshold voltage of the memory cell measured from the PG, and p and d are the PG-to-FG and the drain-to-FG capacitive coupling ratios, respectively. Taking typical values for the parameters into account (p≈50%, d≈10%, $V_d$≈5V, $V_t$ varies between 2V and −4V) it can be calculated that, in order to obtain a reasonable erase time in the order of milliseconds, a PG voltage of −12V is typically required for a state-of-the-art tunnel oxide of 8 nm. In order to generate this high negative voltage on-chip and to switch it onto the PG during the Flash erase operation, an even higher voltage in the order of −16V has to be generated locally inside the charge pump. On the other hand, a very large interpoly oxide field is built up in this erase scheme, resulting in charge leakage from the PG to the FG (which results in a lower boundary for the erased threshold level), and from the FG to the CG (which results in a parasitic erase path), both parasitics indicated by the arrows in FIG. 10.

Figure 12:
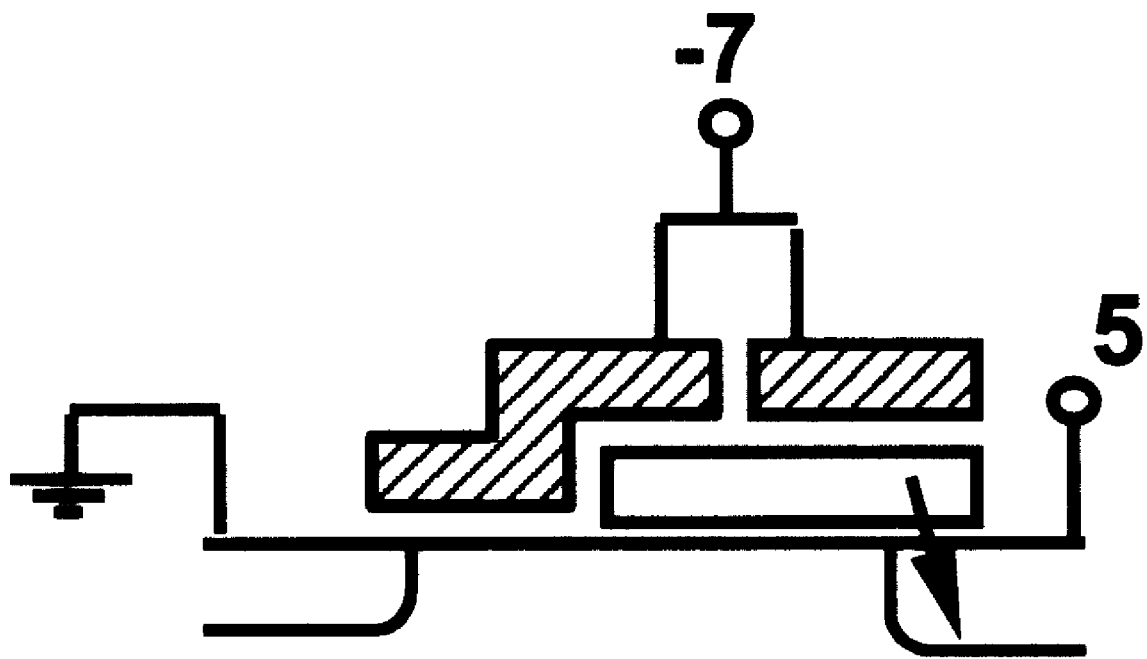
FIG. 12 shows the improved low-voltage erase scheme with a negative bias applied simultaneously to both gates (control gate and program gate).
Figure 13:
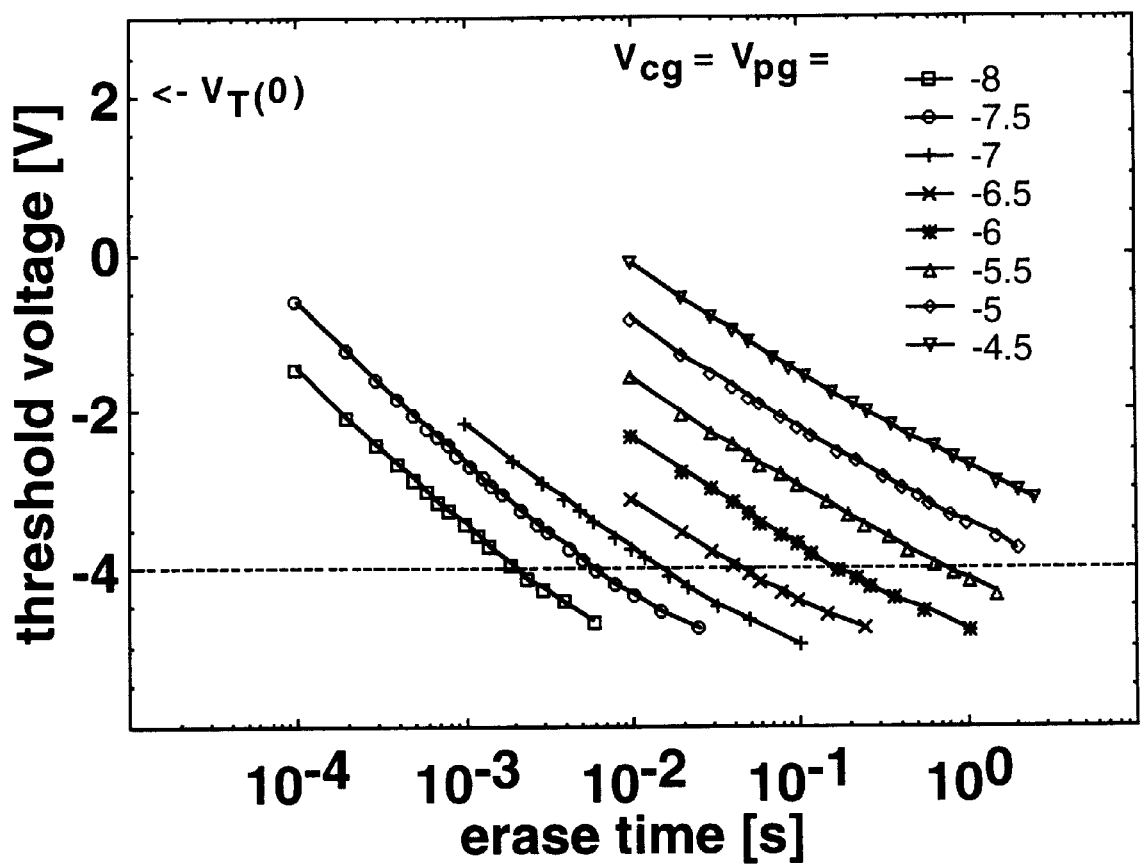
FIG. 13 shows the erase characteristics associated with the scheme of FIG. 12.

These and other considerations result in a very hard boundary condition for scaling down of Flash memory devices to sub-half-micrometer dimensions, especially for embedded applications. Therefore, a new erase scheme is suggested wherein the CG 20 and PG 22 of the considered wordline can be connected through an additional state-of-the-art switch in the row decoder, which is only operated in the erase mode. Then, a negative voltage of approximately −7V is applied to both gates simultaneously, in order to create a high electric field across the tunnel oxide 24 of the memory cell. This is shown schematically in FIG. 12. Since the CG-to-FG coupling ratio is now 'aiding' the build-up of a sufficient oxide field for tunneling of electrons towards the drain junction, the required negative voltage can be reduced from the previous value of −12V down to the more relaxed value of only −7V without sacrificing erase speed. Indeed, in this case, the voltage across the tunnel oxide is given by:

$$|V_{fg}-V_d| \approx p(V_t-V_g)+(1-d)V_d-cV_g \qquad (4)$$

where c is the CG-to-FG coupling ratio (typically 20%) and $V_g$ represents the (common) gate voltage applied to both gates. As compared to Eq.(3) it is clear that the additional term $cV_g$ increases the oxide field independently of the value of the threshold voltage of the cell. The corresponding erase characteristics are shown in FIG. 13. Moreover, due to the smaller erase voltage, and due to the distribution of this voltage across the entire device structure, the electric field in the interpoly dielectric is largely relaxed with respect to the previous scheme of FIG. 10. Therefore, the necessary reliability margins are much easier to accomplish than in the case of FIG. 10.

Figure 14:
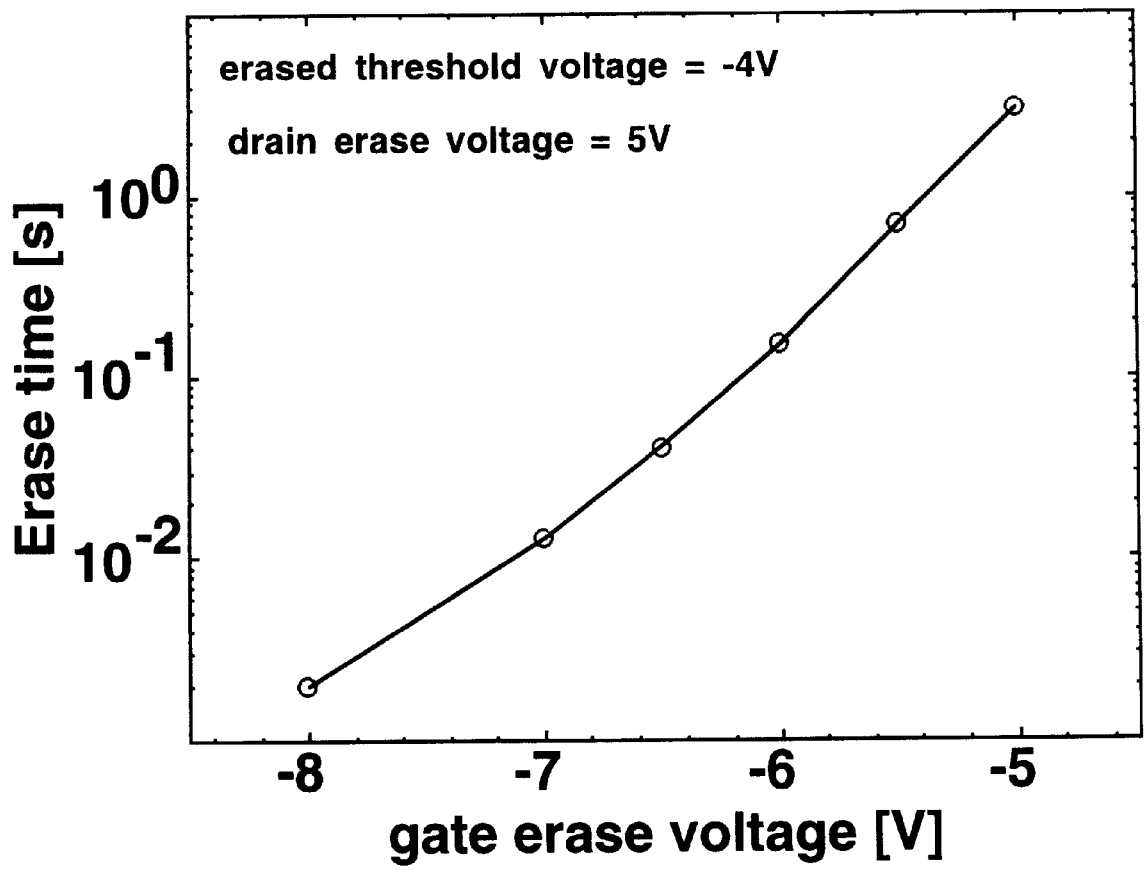
FIG. 14 shows the erase time as a function of the negative gate voltage as extracted from FIG. 13 for a low (erased) threshold voltage of −4V.

FIG. 14 shows the erase time extracted from FIG. 13 as a function of the (negative) erase voltage. It is demonstrated that an array such as the one presented in FIG. 8 can be erased to a threshold voltage of −4V in only 10 ms using only −7V at the gate. If erase speed is not an issue, as in e.g. EPROM replacement applications, the erase voltage can even be decreased further to −5V.

Figure 15:
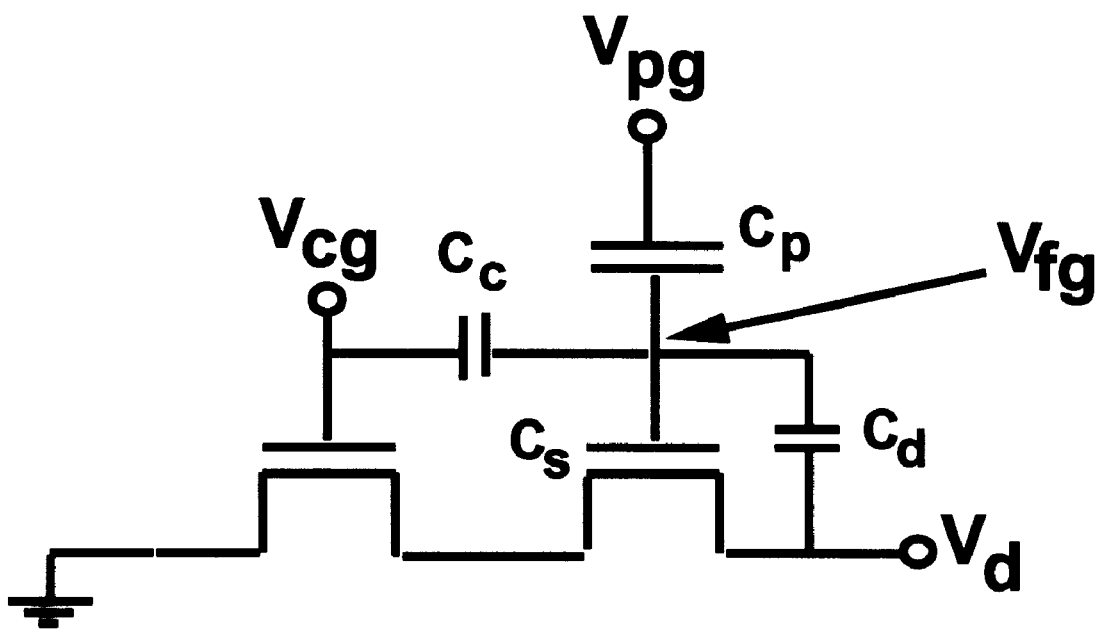
FIG. 15 shows the equivalent circuit for the low-voltage erase scheme.
Figure 16:
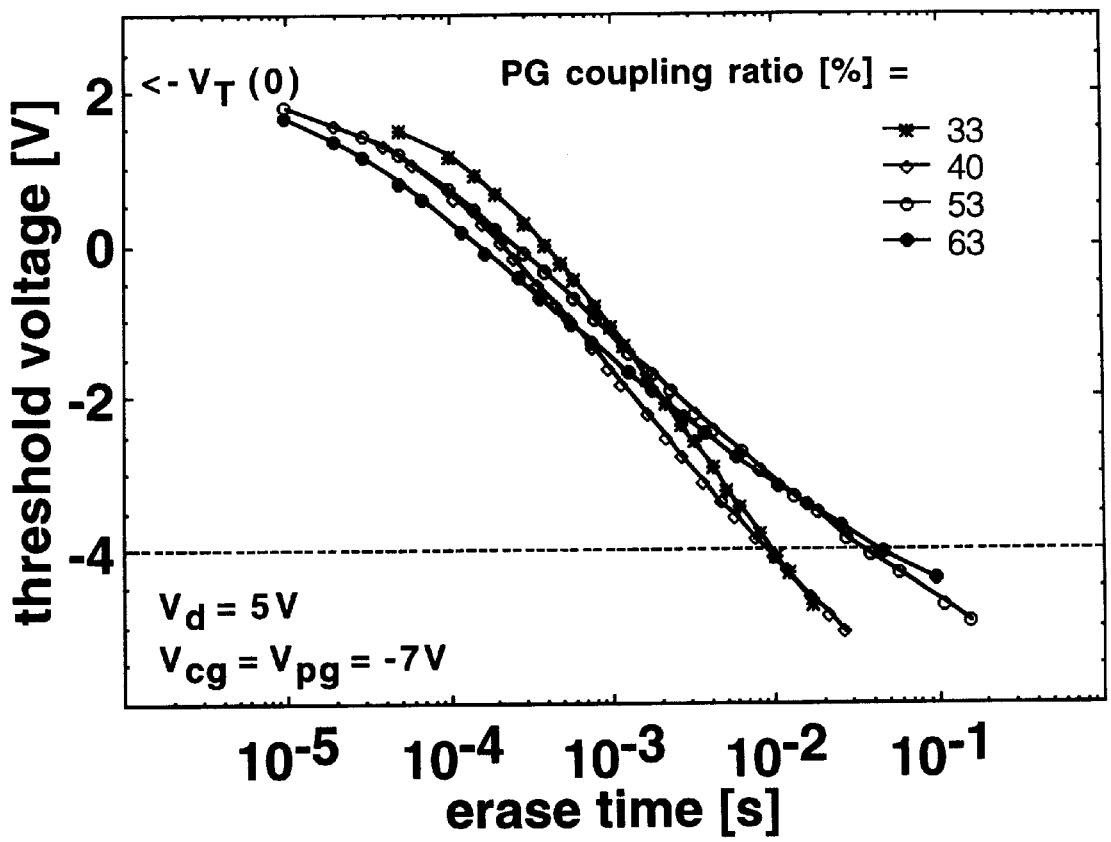
FIG. 16 shows the erase transient characteristics for different program-gate-to-floating-gate coupling ratios p.

FIG. 16 shows the transient erase characteristics for a gate voltage of −7V and for a number of memory cells that differ only according to the coupling capacitor $C_p$ between the PG and the FG. FIG. 15 shows the cell's equivalent circuit, represented by two transistor channels 26, 28 in series and three coupling capacitors $C_d$ 30, $C_p$ 32, and $C_c$ 34 between the FG and the drain, PG and CG, respectively. It is demonstrated that for this particular case, the erase speed increases with decreasing coupling capacitor, and hence with decreasing cell area. This can be explained from Eq.(4): at the beginning of the erase operation, the threshold voltage of the cell is typically 2V which reduces Eq.(4) to:

$$|V_{fg}-V_d| \approx 9p(1-d)V_d+7c \qquad (5)$$

for an erase voltage of −7V. Since p has a larger coefficient than c, the cells with a larger coupling capacitor exhibit a faster erase speed at the beginning of the erase operation (larger initial slope in FIG. 16). At the end of the erase operation, Eq.(4) becomes:

$$|V_{fg}-V_d| \approx 3p+(1-d)V_d+7c \qquad (6)$$

At that point in time, the impact of the c term is already more than twice as large as that of the p term, which explains the faster erase speed at lower (more negative) threshold voltages (final slope in FIG. 16). Physically, it means that the smaller cells require a less positive FG charge for the same externally measured threshold voltage, which corresponds to a higher oxide field, and hence a faster erase speed.

This is a remarkable property since the smaller the cell, the faster it erases, in contrast to other erase schemes known in the prior art. It makes device design much easier since the optimum coupling ratio for programming is never compromised by erase speed requirements. Also, this erase scheme is clearly interesting for scaled-down Flash memories.

Figure 17:
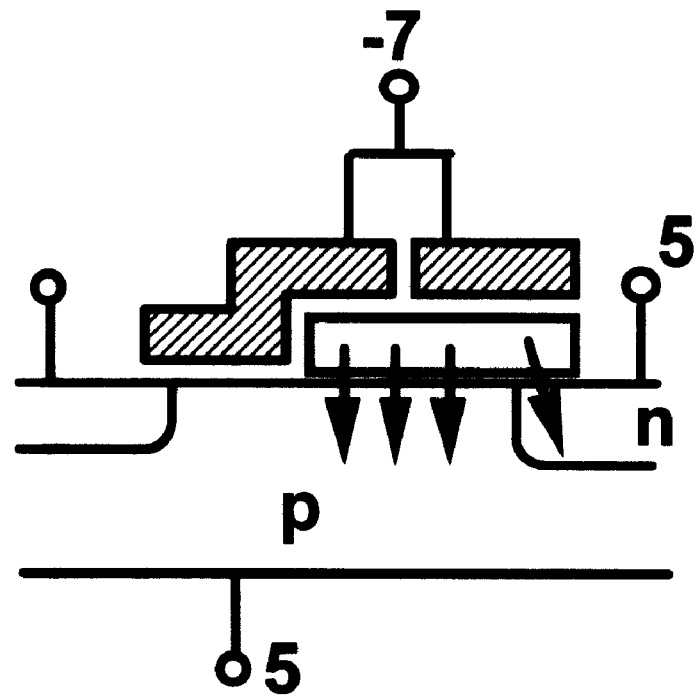
FIG. 17 shows two alternative embodiments of the low-voltage erase scheme with an exemplary voltage of 5V applied to the substrate or p-well of the memory array.
Figure 17:
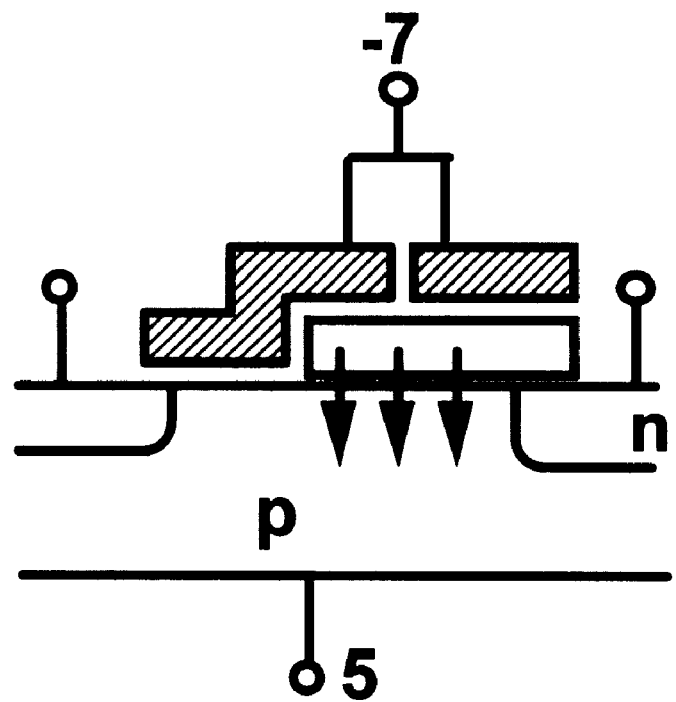

Another embodiment of this new erase scheme is shown in FIG. 17. In this case, the positive voltage is not only applied to the drain 36, but also to the substrate 38 (or p-well) of the memory array. In this case, a high oxide field is established over the entire FG channel region, and the tunneling current and its resulting oxide degradation become more uniformly spread over a wider oxide area. In this erase scheme, which is still requiring only a low voltage in the order of −7V, not only oxide degradation is relaxed with respect to the cases of FIGS. 10 and 12, but also power consumption during the erase operation is greatly reduced. Indeed, it is well-known in the state-of-the-art that the schemes presented in FIGS. 10 and 12 suffer from a relatively high band-to-band tunneling (BBT) current from the drain towards the substrate or p-well. This BBT current is typically several 100's of nA's per cell, which implies a current consumption in the order of tens of mA's for a 64 kbit array or sector. The alternative scheme of FIG. 17 avoids this problem by short-circuiting drain and well. As a result, only the very small tunneling current (nA-level and below) has to be delivered which also results in a low-power erase scheme.

It should be noted that all the above-mentioned erase schemes are explained in the copending application 08/426,685, p.16–17 and table 1, p.25.

Another embodiment of the new erase scheme is obtained when the positive voltage is only applied to the substrate 40 (or p-well) and not to the drain junction 42 of the cell, which is left floating, as depicted in the lower portion of FIG. 17.

As one of ordinary skill in the art can recognize, the foregoing methods can be executed on the memory cell array configuration as detailed in copending application 08/426,685, or on other flash memory cells or array configurations.

Figure 18:
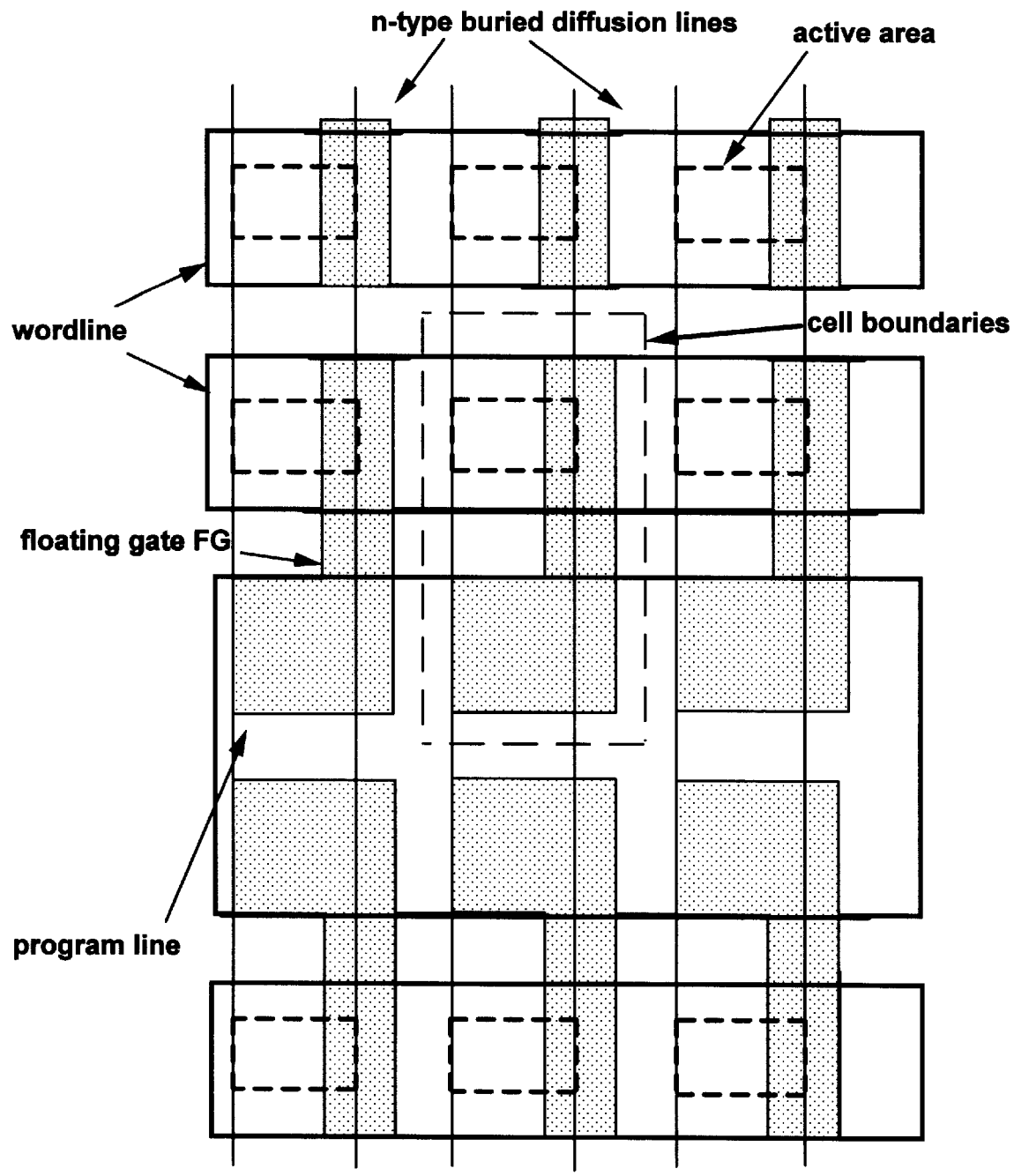
FIG. 18 shows a contactless virtual ground array with shared program gates.

For example, the methods may be used on a HIMOS cell layout as used in a contactless Virtual Ground Array (VGA) with shared program gates, which is shown in FIG. 18. This cell layout corresponds to the array depicted in FIG. 8. The floating gates 44 are formed in the first polysilicon layer, while the control gate 46 and the program gate 48 are formed in the second polysilicon layer. Each program gate serves as a coupling capacitor for two different cells. Duplicating the presented layout in the horizontal direction constitutes a program line 50 which connects all program gates of two adjacent rows of cells. The interconnected control gates form the wordline 52 of the array and is running horizontally over the active transistor area and over the source and drain junctions of the cells sharing the same row. Since the source and drain junctions of the different cells are connected to vertical diffusion lines 54 which run under the polysilicon wordlines 52 and program lines 50, these diffusion lines 54 are connected to a metal strap, for example, every 16 or 32 bits. This explains the term "contactless array".

Figure 19:
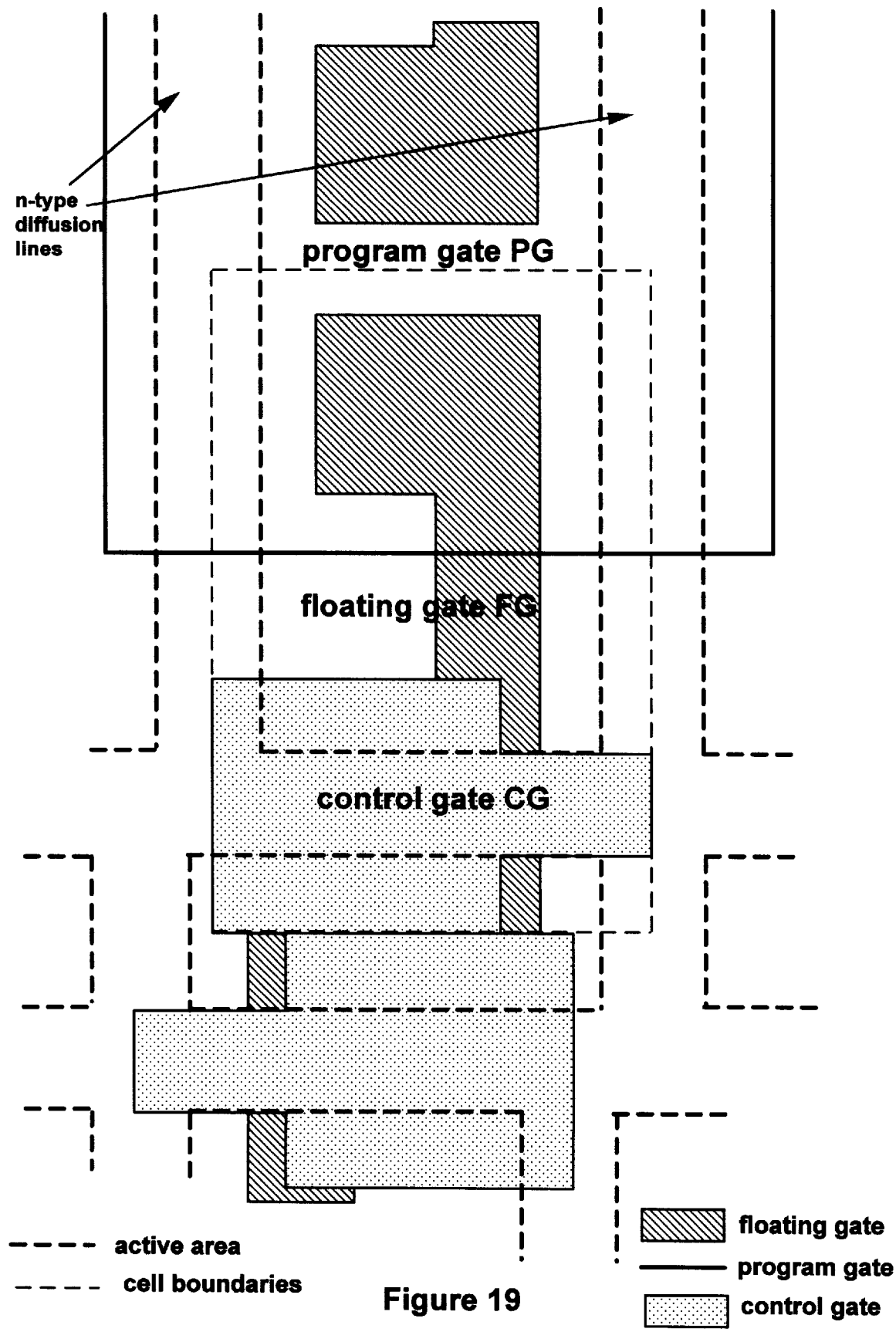
FIG. 19 shows a HIMOS cell layout as used in a contactless VGA array with each row of cells sharing a common program gate with a row on one side, and sharing a wordline with a row on the other side.

FIG. 19 shows a HIMOS cell layout as used in a contactless VGA array with shared program gates 56 and shared control gates 58. In this case, the interconnected control gates of a row, i.e., a wordline 60, is shared between pairs of adjacent rows of cells. Duplicating the presented layout in the horizontal direction constitutes a shared wordline which connects all control gates of two adjacent rows of cells. This is possible due to the triple gate structure of the transistor; although two rows of cells are now selected through the same wordline, programming selectivity is still maintained since the considered rows do not share the same program line 62. In order to obtain programming selectivity on a row of cells, the supply voltage has to be applied to the source junction of the cell that shares its drain junction with the cell being programmed. During the readout operation the program line is grounded, and therefore, readout selectivity is lost if the readout scheme described in the foregoing applications 08/275,016 and 08/080,225 is maintained. This problem can be resolved by applying a negative (deselect) voltage to the program line which is coupled to the row that is unintentionally selected. Consequently, the cells on this deselected row do not draw current during the read-out operation.

Figure 20:
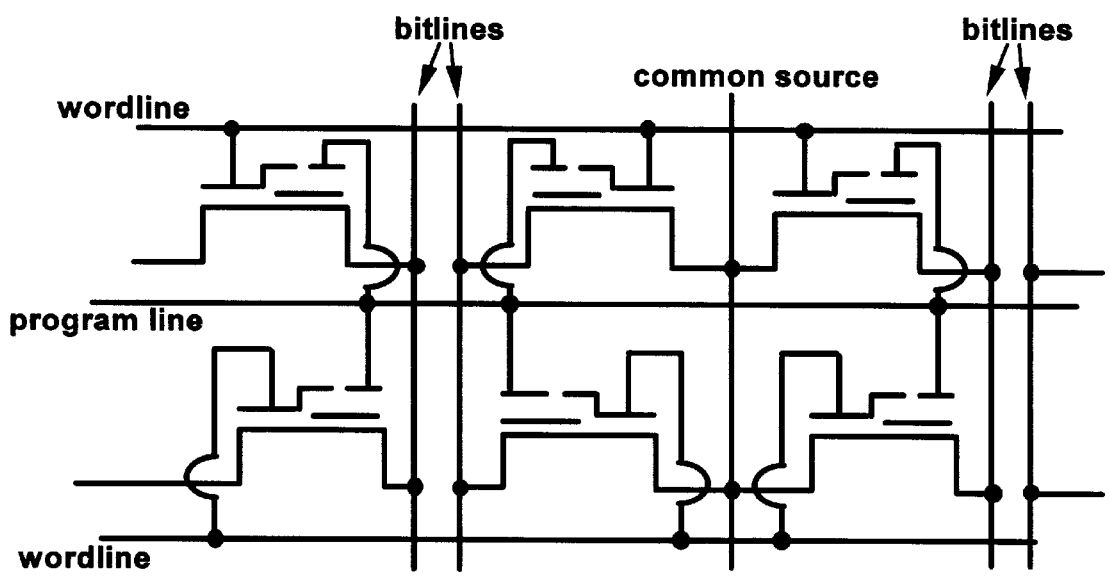
FIG. 20 shows a contactless common source array, where the bitlines of the respective columns in the array are entirely isolated.

FIG. 20 shows a contactless common source array, where the bitlines 64 of the respective columns in the array are entirely isolated from each other. The main advantage of this configuration is the fact that the source lines 66 can be grounded through a substrate (or well) contact, for example, every 16 or 32 bits. In that case, the source potential always stays close to the ground potential which ensures a high readout speed, even in large memory arrays. Another advantage is the straightforward decoder design.

Preferred embodiments of the present invention have been described herein. It is to be understood, however, that changes and modifications can be made without departing from the true scope and spirit of the present invention. The true scope and spirit of the present invention are defined by the following claims, to be interpreted in light of the foregoing specification.

We claim:

1. A method of erasing an array or part of an array of nonvolatile memory cells, said cells comprising a semiconductor substrate including a source and a drain region and a channel therebetween, a floating gate extending over a portion of the drain region with a thin oxide layer therebetween, and over a portion of said channel, further referred to as the floating-gate channel, and ending over said channel, a control gate extending over another portion of the channel region, further referred to as the control-gate channel, and over a portion of the source region, an additional program gate capacitively coupled through a dielectric layer to said floating gate, said array or part of an array comprising a number of rows of said cells, wherein said control gates of said cells on the same row are connected to a common wordline, and said program gates of said cells are connected to a common program line, said method comprising the steps of:

(i) applying a first voltage comprising an on-chip generated negative voltage in the order of −7V simultaneously to at least one of said program lines and to at least one of said wordlines thereby coupling a negative voltage to said floating gates of said cells that share both said wordline and said program line; and (ii) applying a second voltage to said drain regions of said cells, said second voltage being equal to the supply voltage, to thereby cause a tunneling current of electrons to flow from said floating gates of said cells towards said drain junctions of said cells while achieving simultaneous erasure of said memory cells sharing both said wordline and said program line without the need for high negative voltages.

2. A method of erasing an array or a party of an array of nonvolatile memory cells, said cells comprising a semiconductor substrate including a source and a drain region and a channel therebetween, a floating gate extending over a portion of the drain region, and over a portion of said channel with a thin oxide layer therebetween, further referred to as the floating-gate channel, and ending over said channel, a control gate extending over another portion of the channel region, further referred to as the control-gate channel, and over a portion of the source region, an additional program gate capacitively coupled through a dielectric layer to said floating gate, said array or part of an array comprising a number of rows of said cells, sharing a common substrate, wherein said control gates of said cells on the same row are connected to a common wordline, and said program gates of said cells are connected to a common program line, said method comprising the steps of:
  (i) applying a first voltage comprising an on-chip generated negative voltage in the order of −7V simultaneously to at least one of said program lines and to at least one of said wordlines thereby coupling a negative voltage to said floating gates of said cells that share both said wordline and said program line; and
  (ii) applying a second voltage to said common substrate of said cells, said second voltage being equal to the supply voltage,
to thereby cause a tunneling current of electrons to flow from said floating gates of said cells towards said substrate of said cells while achieving simultaneous erasure of said memory cells sharing both said wordline and said program line without the need for high negative voltages nor a high power consumption from the supply voltage.

3. The method as recited in claim 2, wherein said second voltage is simultaneously applied to said common substrate of said cells and to said drain regions of said cells.

4. A method of erasing an array or part of an array of nonvolatile memory cells,
  said cells comprising a semiconductor substrate including a source and a drain region and a channel therebetween, a floating gate extending over a portion of the drain region with a thin oxide layer therebetween, and over a portion of said channel, further referred to as the floating-gate channel, and ending over said channel, a control gate extending over another portion of the channel region, further referred to as the control-gate channel, and over a portion of the source region, an additional program gate capacitively coupled through a dielectric layer to said floating gate, said array or part of an array comprising a number of rows of said cells, wherein said control gates of said cells on the same row are connected to a common wordline, and said program gates of said cells are connected to a common program line, said method comprising the steps of:
  (i) applying a first voltage comprising an on-chip generated negative voltage in the order of −7V simultaneously to at least one of said program lines and to at least one of said wordlines thereby coupling a negative voltage to said floating gates of said cells that share both said wordline and said program line; and
  (ii) applying a second voltage to said drain regions of said cells, said second voltage being an on-chip generated voltage higher than the supply voltage, to thereby cause a tunneling current of electrons to flow from said floating gates of said cells towards said drain junctions of said cells while achieving simultaneous erasure of said memory cells sharing both said wordline and said program line without the need for high negative voltages.

5. A method of erasing an array or a party of an array of nonvolatile memory cells,
  said cells comprising a semiconductor substrate including a source and a drain region and a channel therebetween, a floating gate extending over a portion of the drain region, and over a portion of said channel with a thin oxide layer therebetween, further referred to as the floating-gate channel, and ending over said channel, a control gate extending over another portion of the channel region, further referred to as the control-gate channel, and over a portion of the source region, an additional program gate capacitively coupled through a dielectric layer to said floating gate, said array or part of an array comprising a number of rows of said cells, sharing a common substrate, wherein said control gates of said cells on the same row are connected to a common wordline, and said program gates of said cells are connected to a common program line, said method comprising the steps of:
  (i) applying a first voltage comprising an on-chip generated negative voltage in the order of −7V simultaneously to at least one of said program lines and to at least one of said wordlines thereby coupling a negative voltage to said floating gates of said cells that share both said wordline and said program line; and
  (ii) applying a second voltage to said common substrate of said cells, said second voltage being an on-chip generated voltage higher than the supply voltage;
to thereby cause a tunneling current of electrons to flow from said floating gates of said cells towards said substrate of said cells while achieving simultaneous erasure of said memory cells sharing both said wordline and said program line without the need for high negative voltages nor a high power consumption from the supply voltage.

6. The method as recited in claim 5, wherein said second voltage is simultaneously applied to said common substrate of said cells and to said drain regions of said cells.

* * * * *